US012660472B2

(12) United States Patent
Yoo et al.

(10) Patent No.:     US 12,660,472 B2
(45) Date of Patent:          Jun. 16, 2026

(54) DISPLAY DEVICE INCLUDING REVERSE TAPERED PARTITION WALL

(71) Applicant: SAMSUNG DISPLAY CO., LTD., Yongin-si (KR)

(72) Inventors: Byung Han Yoo, Yongin-si (KR); Dae Young Lee, Yongin-si (KR); Sang Woo Kim, Yongin-si (KR); Jun Gi Kim, Yongin-si (KR); Min Oh Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 580 days.

(21) Appl. No.: 18/172,249

(22) Filed:      Feb. 21, 2023

(65)              Prior Publication Data
       US 2023/0345795 A1      Oct. 26, 2023

(30)         Foreign Application Priority Data
    Apr. 26, 2022    (KR) ........................ 10-2022-0051667

(51) Int. Cl.
     *H10K 59/65*          (2023.01)
     *G06V 40/13*          (2022.01)
            (Continued)
(52) U.S. Cl.
     CPC ......... *H10K 59/65* (2023.02); *G06V 40/1318* (2022.01); *H10K 59/122* (2023.02);
            (Continued)

(58) Field of Classification Search
     CPC .... H10K 59/65; H10K 59/122; H10K 59/353; H10K 59/40; H10K 59/873; H10K 59/38;
            (Continued)

(56)              References Cited

U.S. PATENT DOCUMENTS 6,559,604 B2 *   5/2003  Lu ........................ H10K 59/173
                                                          313/506
6,626,721 B1 *   9/2003  Van Slyke ........... H10K 59/173
                                                          313/506

(Continued)

FOREIGN PATENT DOCUMENTS

CN          107480639 A      12/2017
CN          111785854 A      10/2020
            (Continued)

OTHER PUBLICATIONS

Yang, Hsueh-Yen, Hong-Shen Lin, and Hen-Wai Tsao. "The method of ⅔ sampled sub-pixel rendering for AMO LED display." Journal of Display Technology 12.2 (2015): 158-164.

*Primary Examiner* — Ida M Soward
(74) *Attorney, Agent, or Firm* — F. CHAU & ASSOCIATES, LLC

(57)              ABSTRACT
A display device includes a substrate. A circuit layer is disposed on the substrate and including includes a pixel circuit and a sensor circuit. A pixel element layer is disposed on the circuit layer and includes a light emitting element electrically connected to the pixel circuit. A light receiving element is electrically connected to the sensor circuit. A pixel defining layer is disposed on the circuit layer. A partition wall is disposed on the pixel defining layer. The partition wall has a reverse taper shape.

20 Claims, 16 Drawing Sheets

LD: AE, EML, CE
OPD: DE, OPL, UE
PAL: DPL, SSL
E1: AE, DE
E2: CE, UE, RML

(51) Int. Cl.
| | |
|---|---|
| *H10K 59/122* | (2023.01) |
| *H10K 59/35* | (2023.01) |
| *H10K 59/40* | (2023.01) |
| *H10K 59/80* | (2023.01) |

(52) U.S. Cl.
CPC ........... *H10K 59/353* (2023.02); *H10K 59/40* (2023.02); *H10K 59/873* (2023.02); *H10K 59/352* (2023.02)

(58) Field of Classification Search
CPC ...... H10K 59/60; H10K 59/352; H10K 50/81; H10K 50/82; H10H 29/142; H10H 86/441; H10H 86/481
See application file for complete search history.

(56) References Cited

U.S. PATENT DOCUMENTS

| | | | | |
|---|---|---|---|---|
| 7,605,533 | B2 * | 10/2009 | Tzen | H10K 59/38 |
| | | | | 313/506 |
| 7,834,543 | B2 * | 11/2010 | Takata | H10K 59/80522 |
| | | | | 445/24 |
| 8,053,983 | B2 * | 11/2011 | Abe | H10K 50/841 |
| | | | | 313/506 |
| 8,866,176 | B2 * | 10/2014 | Hirakata | H10K 59/122 |
| | | | | 257/40 |
| 9,093,669 | B2 | 7/2015 | Park et al. | |
| 9,337,244 | B2 * | 5/2016 | Hatano | H10K 59/8723 |
| 9,577,209 | B2 * | 2/2017 | Tanada | H10K 59/80516 |
| 11,043,543 | B2 * | 6/2021 | Yoshizumi | H10K 59/131 |
| 11,121,197 | B2 * | 9/2021 | Huang | H10K 59/873 |
| 11,394,014 | B2 | 7/2022 | Kubota et al. | |
| 2001/0054867 | A1 * | 12/2001 | Kubota | H10K 59/873 |
| | | | | 313/504 |
| 2004/0100191 | A1 * | 5/2004 | Park | H10K 71/20 |
| | | | | 313/506 |
| 2005/0236983 | A1 * | 10/2005 | Sakai | H10K 50/82 |
| | | | | 313/506 |
| 2007/0194307 | A1 * | 8/2007 | Kim | H10K 50/82 |
| | | | | 257/40 |
| 2009/0009069 | A1 * | 1/2009 | Takata | H10K 50/824 |
| | | | | 445/24 |
| 2009/0015153 | A1 * | 1/2009 | Asano | H05B 33/04 |
| | | | | 313/504 |
| 2012/0205675 | A1 * | 8/2012 | Yamazaki | H10K 59/86 |
| | | | | 257/40 |
| 2012/0208303 | A1 * | 8/2012 | Yamazaki | H10K 71/00 |
| | | | | 257/E33.061 |
| 2012/0217516 | A1 * | 8/2012 | Hatano | H10K 50/8428 |
| | | | | 257/E33.062 |
| 2012/0228603 | A1 * | 9/2012 | Nakamura | H10K 50/824 |
| | | | | 257/40 |
| 2014/0183479 | A1 * | 7/2014 | Park | H10K 59/131 |
| | | | | 438/34 |
| 2014/0183501 | A1 * | 7/2014 | Kim | H10K 59/1315 |
| | | | | 438/34 |
| 2016/0064460 | A1 | 3/2016 | Kim et al. | |
| 2016/0079325 | A1 * | 3/2016 | Lee | H10K 71/00 |
| | | | | 438/26 |
| 2017/0012240 | A1 * | 1/2017 | Nakajima | H10K 50/844 |
| 2018/0143721 | A1 * | 5/2018 | Matsueda | G06F 3/0412 |
| 2018/0151842 | A1 * | 5/2018 | Park | H10K 50/865 |
| 2019/0058020 | A1 * | 2/2019 | Tsai | G06F 3/044 |
| 2019/0279566 | A1 * | 9/2019 | Wang | G06V 40/1318 |
| 2020/0027936 | A1 * | 1/2020 | Wang | H10K 59/122 |
| 2020/0313102 | A1 * | 10/2020 | Kim | H10K 59/8723 |
| 2021/0167144 | A1 * | 6/2021 | Lim | H10K 59/875 |
| 2021/0191552 | A1 | 6/2021 | Box et al. | |
| 2021/0192170 | A1 * | 6/2021 | Ma | G06V 10/141 |
| 2021/0200366 | A1 | 7/2021 | Box et al. | |
| 2021/0359004 | A1 | 11/2021 | Ai | |
| 2021/0391388 | A1 | 12/2021 | Nakagawa et al. | |
| 2021/0408163 | A1 * | 12/2021 | Heo | H10K 59/8723 |
| 2022/0036826 | A1 * | 2/2022 | Cha | G09G 3/2003 |
| 2022/0199937 | A1 * | 6/2022 | Nitta | H10K 59/8723 |
| 2022/0214758 | A1 * | 7/2022 | Cheng | G06F 3/042 |
| 2023/0389393 | A1 * | 11/2023 | Kinjo | H10K 59/1315 |

FOREIGN PATENT DOCUMENTS

| | | |
|---|---|---|
| JP | 2021-039342 | 3/2021 |
| KR | 10-2016-0072010 | 6/2016 |
| KR | 10-2020805 | 8/2019 |
| KR | 10-2021-0060617 | 5/2021 |
| KR | 10-2021-0069776 | 6/2021 |
| KR | 10-2021-0082316 | 7/2021 |
| KR | 10-2021-0086907 | 7/2021 |

* cited by examiner

PAL: DPL, SSL
E1: AE, DE
E2: CE, UE

LD: AE, EML, CE
OPD: DE, OPL, UE
PAL: DPL, SSL
E1: AE, DE
E2: CE, UE, RML

LD: AE, EML, CE
OPD: DE, OPL, UE
PAL: DPL, SSL
E1: AE, DE
E2: CE, UE

E1: AE, DE

LD: AE, EML, CE
OPD: DE, OPL, UE
E1: AE, DE
E2: CE, UE, RML

DISPLAY DEVICE INCLUDING REVERSE TAPERED PARTITION WALL

CROSS-REFERENCE TO RELATED APPLICATION

This application claims priority under 35 U.S.C. § 119 to Korean Patent Application No. 10-2022-0051667, filed on Apr. 26, 2022, the content of which is herein incorporated by reference herein in its entirety.

TECHNICAL FIELD

The present disclosure relates to a display device and, more specifically to a display device including a partition.

DISCUSSION OF THE RELATED ART

Biometric authentication methods, such as fingerprint identification, are widely used to unlock electronic devices such as smartphones and tablet computers. In order to provide a fingerprint sensing function, a fingerprint sensor may be provided in a form in which the fingerprint sensor is embedded in or attached to the display device.

A fingerprint sensor of a light sensing method may include a light source and a light sensor. The light sensor may obtain fingerprint information by receiving reflected light or the like generated by the user's fingerprint.

SUMMARY

A display device includes a substrate, a circuit layer disposed on the substrate and including a pixel circuit and a sensor circuit, a pixel element layer disposed on the circuit layer and including a light emitting element electrically connected to the pixel circuit, a light receiving element electrically connected to the sensor circuit, and a pixel defining layer disposed on the circuit layer, and a partition wall disposed on the pixel defining layer. The partition wall has a reverse taper shape.

In an embodiment, an angle formed between a side surface and a lower surface of the partition wall may exceed 90°.

In an embodiment, the light emitting element may include an anode electrode, a light emitting layer disposed on the anode electrode, and a cathode electrode disposed on the light emitting layer, and the light receiving element may include a first sensor electrode, a light receiving layer disposed on the first sensor electrode, and a second sensor electrode disposed on the light receiving layer.

In an embodiment, the cathode electrode and the second sensor electrode may include a same material.

In an embodiment, the cathode electrode and the second sensor electrode may be spaced apart from each other with respect to the partition wall disposed between the cathode electrode and the second sensor electrode.

In an embodiment, the display device may further include a dummy layer disposed on the partition wall.

In an embodiment, the cathode electrode, the second sensor electrode, and the dummy layer may include a same material and may be spaced apart from each other.

In an embodiment, the anode electrode and the first sensor electrode may include a same material.

In an embodiment, the pixel defining layer may be disposed on the anode electrode of the light emitting element and the first sensor electrode of the light receiving element, and may include a first opening exposing a portion of the anode electrode and a second opening exposing a portion the first sensor electrode.

In an embodiment, the first opening may correspond to a light emitting area from which light of the light emitting element is emitted, and the second opening may correspond to a light receiving area through which the light receiving element receives the light.

In an embodiment, the display device may further include a thin film encapsulation layer disposed on the cathode electrode of the light emitting element and the second sensor electrode of the light receiving element and covering the light emitting element and the light receiving element.

In an embodiment, the display device may further include a touch sensor disposed on the thin film encapsulation layer.

A display device includes a substrate, and a pixel element layer disposed on the substrate and including sub-pixels and light sensing pixels. Each of the sub-pixels includes a light emitting element and a light emitting area from which the light is emitted, each of the light sensing pixels includes a light receiving element outputting a sensing signal corresponding to the light and a light receiving area receiving the light. The light emitting area and the light receiving area are spaced apart from each other on the substrate. A partition wall is disposed between the light emitting area and the light receiving area.

In an embodiment, the partition wall may surround the light receiving area.

In an embodiment, the partition wall may include an opening area that is at least partially opened.

In an embodiment, each of the sub-pixels may include a light emitting element and each of the light sensing pixels may include a light receiving element. The light emitting element may include an anode electrode, a light emitting layer disposed on the anode electrode, and a cathode electrode disposed on the light emitting layer, and the light receiving element may include a first sensor electrode, a light receiving layer disposed on the first sensor electrode, and a second sensor electrode disposed on the light receiving layer.

In an embodiment, the cathode electrode and the second sensor electrode may include a same material.

In an embodiment, the cathode electrode and the second sensor electrode may be spaced apart from each other with respect to the partition wall disposed between the cathode electrode and the second sensor electrode.

In an embodiment, the cathode electrode and the second sensor electrode may be integrally formed and may be electrically connected to each other through the opening area of the partition wall.

In an embodiment, the display device may further include a dummy layer disposed on the partition wall. The dummy layer may include a same material as the cathode electrode and the second sensor electrode.

BRIEF DESCRIPTION OF THE DRAWINGS

The above and other features of the disclosure will become more apparent by describing in further detail embodiments thereof with reference to the accompanying drawings, in which:

FIG. 5 is an enlarged cross-sectional view of a portion of a display panel included in the display device of FIG. 3;

DETAILED DESCRIPTION OF THE EMBODIMENT

Figure 1:
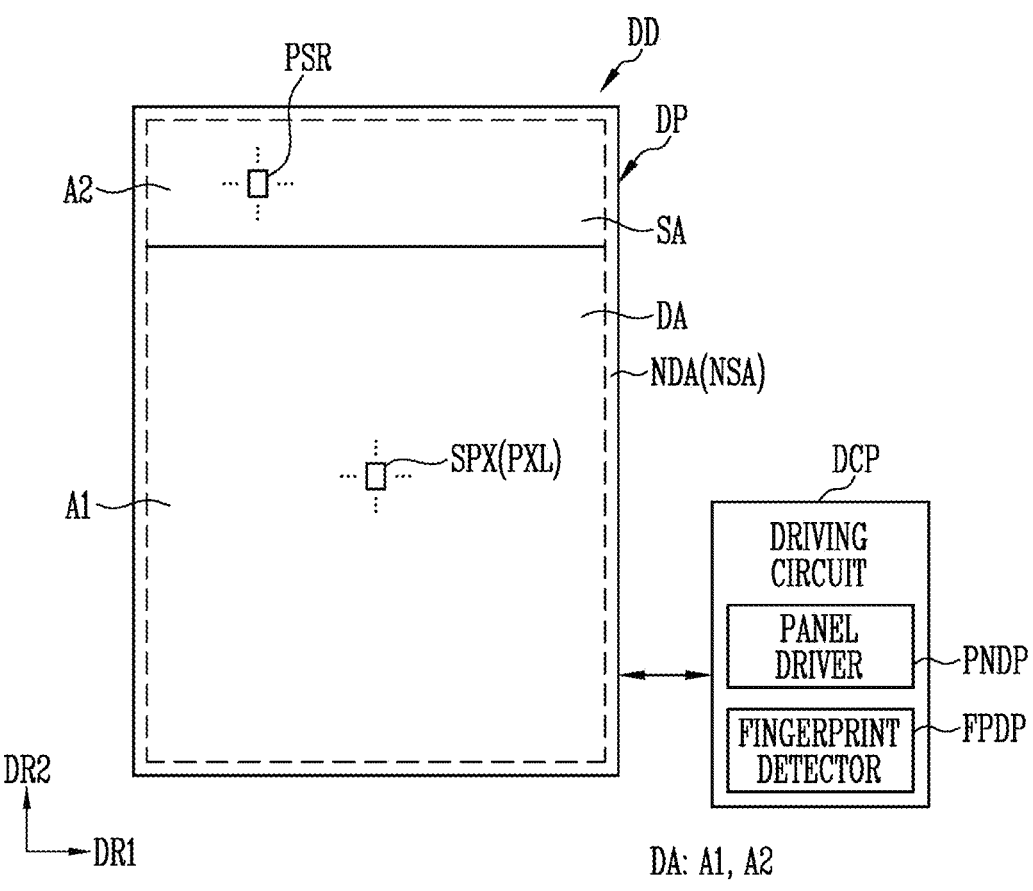
FIGS. 1 and 2 are plan views schematically illustrating a display device according to embodiments of the disclosure.

Similar reference numerals may be used to represent similar components in describing each drawing. The accompanying drawings are intended to be drawn to scale for at least one embodiment of the present disclosure and so the relative lengths, angles, thicknesses and other dimensions may be understood from these figures, however, it is to be understood that the present invention is not necessarily limited to the relative lengths, angles, and thicknesses shown. Terms of "first", "second", and the like may be used to describe various components, but the components should not necessarily be limited by the terms. The terms are used for the purpose of distinguishing one component from another component. For example, without departing from the scope of the present disclosure, a first component may be referred to as a second component, and similarly, a second component may also be referred to as a first component. The singular expression includes the plural expression unless the context clearly dictates otherwise.

It should be understood that in the present application, a term of "comprise," "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance.

In addition, a case where a portion of a layer, a film, an area, a plate, or the like is referred to as being "on" another portion, it includes not only a case where the portion is "directly on" another portion, but also a case where there is further another portion between the portion and another portion. In addition, in the present specification, when a portion of a layer, a film, an area, a plate, or the like is formed on another portion, a forming direction is not necessarily limited to an upper direction but includes forming the portion on a side surface or in a lower direction. When a portion of a layer, a film, an area, a plate, or the like is formed "under" another portion, this includes not only a case where the portion is "directly beneath" another portion but also a case where there is further another portion between the portion and another portion.

Hereinafter, embodiments of the disclosure are described in more detail with reference to the accompanying drawings.

Figure 2:
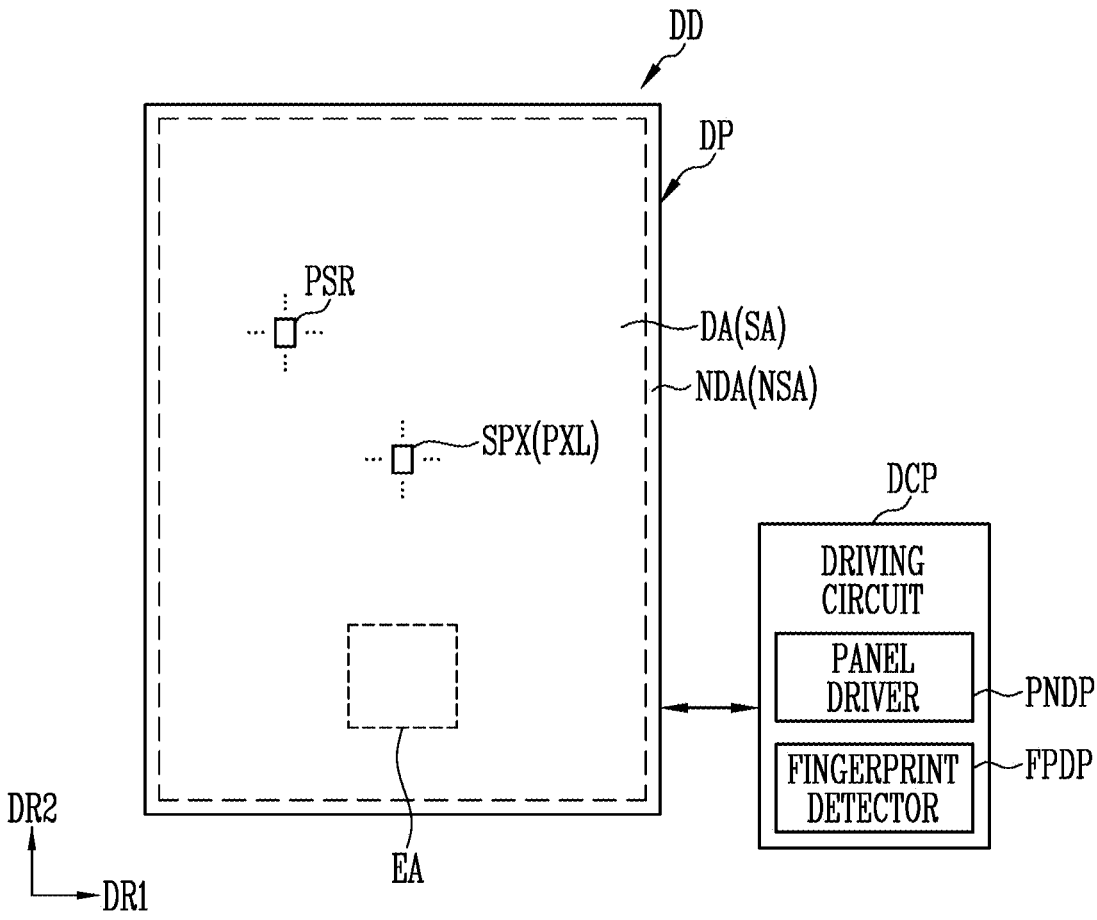

FIGS. 1 and 2 are plan views schematically illustrating a display device according to embodiments of the disclosure. FIGS. 1 and 2 show a display panel DP included in a display device DD according to embodiments of the disclosure and a driving circuit DCP for driving the display panel DP.

Although the display panel DP and the driving circuit DCP are shown separately in FIGS. 1 and 2, an embodiment of the disclosure is not necessarily limited thereto. According to an embodiment, all or a portion of the driving circuit DCP may be integrally implemented on the display panel DP.

Referring to FIGS. 1 and 2, the display device DD may include the display panel DP and the driving circuit DCP for driving the display panel DP.

The display device DD may be provided in various shapes, and for example, the display device DD may have a rectangular plate shape having two pairs of sides parallel to each other, but embodiments of the disclosure are not necessarily limited thereto. When the display device DD is provided in the rectangular plate shape, any one pair of sides of the two pairs of sides may be provided longer than the other pair of sides. For convenience of description, FIGS. 1 and 2 show a case in which the display device DD has a rectangular shape having a pair of long sides and a pair of short sides, an extension direction of the pair of long sides is shown as a second direction DR2, and an extension direction of the pair of short sides is shown as a first direction DR1. According to an embodiment, the display device DD provided in the rectangular plate shape may have a round shape at a corner portion where one long side and one short side contact each other.

In an embodiment, at least a portion of the display device DD may be flexible, and the display device DD may be folded at the portion having flexibility.

The display device DD may be a flat display device, a flexible display device, a curved display device, a foldable display device, or a bendable display device. In addition, the display device DD may be applied to a transparent display device, a head-mounted display device, a wearable display device, and the like.

The display panel DP may include a display area DA and a non-display area NDA. In the display area DA, sub-pixels SPX (or pixels PXL) may produce an image, and thus an image may be displayed in the display area DA. The non-display area NDA may be disposed on at least one side of the display area DA. For example, the non-display area NDA may at least partially surround the display area DA.

A plurality of sub-pixels SPX may be disposed in the display area DA. Each of the sub-pixels SPX may include at least one light emitting element. The light emitting element may be an organic light emitting diode (OLED) or a light emitting unit including ultra-small inorganic light emitting diodes having a size of a micro to nano scale range, but is not necessarily limited thereto. The display device DD may display an image on the display area DA by driving the sub-pixels SPX in response to input image data.

The non-display area NDA may be an area surrounding at least one side of the display area DA, and may be a remaining area except for the display area DA. The non-display area NDA may include a line area, a pad area, various dummy areas, and/or the like.

In an embodiment, one area of the display area DA may be set as a sensing area SA capable of sensing a user's fingerprint or the like. For example, at least a portion of the display area DA may be the sensing area SA. The sensing area SA may include at least some of the sub-pixels SPX disposed in the display area DA.

In an embodiment, only a portion of the display area DA may be set as the sensing area SA. However, the present disclosure is not necessarily limited thereto. For example, the entire display area DA may be set as the sensing area SA. When the entire display area DA is set as the sensing area SA, the non-display area NDA surrounding the display area DA may become a non-sensing area NSA. A plurality of light sensing pixels PSR (or light sensors) may be disposed in the sensing area SA together with the plurality of sub-pixels SPX.

Each of the light sensing pixels PSR may include a light receiving element including a light receiving layer. In the display area DA, the light receiving layer of the light receiving element may be spaced apart from a light emitting layer of the light emitting element.

The plurality of light sensing pixels PSR may be spaced apart from each other over the entire area of the display area DA. However, the present disclosure is not necessarily limited thereto. For example, as shown in FIG. 1, the display area DA may be divided into a first area A1 and a second area A2 in the second direction DR2, and the light sensing pixels PSR may be disposed only in the second area A2. In addition, as an example, the light sensing pixels PSR may be disposed in at least a portion of the non-display area NDA.

The light sensing pixels PSR may sense that light emitted from a light source (for example, the light emitting element) is reflected by an external object (for example, a user's finger or the like). For example, the user's fingerprint may be sensed through each of the light sensing pixels PSR. Hereinafter, an embodiment in which the light sensing pixels PSR are used for a fingerprint sensing purpose is described as an example, but in various embodiments, the light sensing pixels PSR may sense various pieces of biometric information such as from the iris and arrangement of veins. In addition, the light sensing pixels PSR may sense external light and may perform a function of a gesture sensor, a motion sensor, a proximity sensor, an illuminance sensor, an image sensor, and the like.

The driving circuit DCP may drive the display panel DP. For example, the driving circuit DCP may output a data signal corresponding to image data to the display panel DP, or may output a driving signal for the light sensing pixels PSR and receive an electrical signal (for example, a sensing signal) received from the light sensing pixels PSR. The driving circuit DCP may detect a user's fingerprint shape using the electrical signals.

The driving circuit DCP may include a panel driver PNDP and a fingerprint detector FPDP (or a sensor driver). For convenience of description, although the panel driver PNDP and the fingerprint detector FPDP are shown as separate configurations in FIGS. 1 and 2, an embodiment of the disclosure is not necessarily limited thereto. For example, at least a portion of the fingerprint detector FPDP may be integrated together with the panel driver PNDP or may operate in conjunction with the panel driver PNDP.

The panel driver PNDP may supply a data signal corresponding to an image data signal to the sub-pixels SPX of the display area DA while sequentially scanning the sub-pixels SPX. In this case, the display panel DP may display an image corresponding to the image data.

The panel driver PNDP may supply a driving signal for fingerprint sensing to the sub-pixels SPX. Such a driving signal may be sent to the sub-pixels SPX so that the sub-pixels SPX emit light to operate as a light source for the light sensing pixels PSR. The panel driver PNDP may supply the driving signal and/or another driving signal for the fingerprint sensing to the light sensing pixels PSR.

However, the present disclosure is not necessarily limited thereto, and the driving signals for the fingerprint sensing may be disposed by the fingerprint detector FPDP.

The fingerprint detector FPDP may detect biometric information such as a user's fingerprint based on the sensing signal received from the light sensing pixels PSR. The fingerprint detector FPDP may supply the driving signals to the light sensing pixels PSR and/or the sub-pixels SPX.

Figure 3:
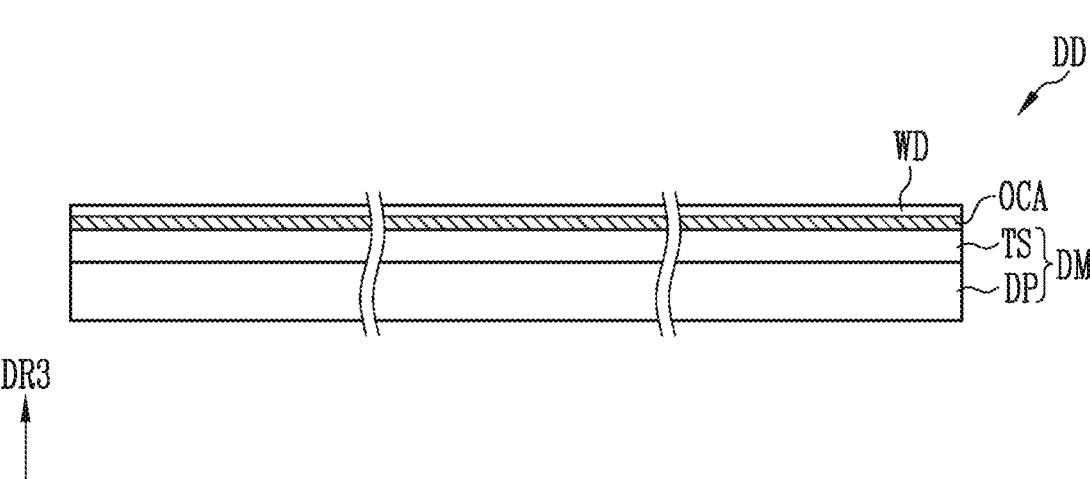
FIG. 3 is a schematic cross-sectional view of a display device according to embodiments of the disclosure.

FIG. 3 is a schematic cross-sectional view of a display device according to embodiments of the disclosure. In FIG. 3, a thickness direction of the display device DD is shown as a third direction DR3.

Referring to FIG. 3, the display device DD may include a display module DM and a window WD.

The display module DM may include a display panel DP and a touch sensor TS.

The touch sensor TS may be disposed directly on the display panel DP or may be disposed on the display panel DP with a separate layer such as an adhesive layer or a substrate (or an insulating layer) interposed therebetween.

The display panel DP may display an image. As the display panel DP, a display panel capable of self-emission, such as an organic light emitting display panel (OLED panel) may be used. However, an embodiment of the disclosure is not necessarily limited thereto, and for example, as the display panel DP, a non-emission display panel such as a liquid crystal display panel (LCD panel), an electro-phoretic display panel (EPD panel), and an electro-wetting display panel (EWD panel) may be used. When the non-emission display panel is used as the display panel DP, the display device DD may include a backlight unit that supplies light to the display panel DP.

The touch sensor TS may be disposed on a surface on which an image of the display panel DP is emitted to receive a touch input of a user. The touch sensor TS may recognize a touch event of the display device DD through a user's hand or a separate input means. The touch sensor TS may recognize the touch event in a capacitance method. For example, the touch sensor TS may sense the touch input in a mutual capacitance method or may sense the touch input in a self capacitance method.

The window WD for protecting an exposed surface of the display module DM may be disposed on the display module DM. The window WD may protect the display module DM from external impact, and may provide an input surface and/or a display surface to the user. The window WD may be coupled to the display module DM using an optically transparent adhesive OCA.

The window WD may have a multiple layer structure including a glass substrate, a plastic film, and/or a plastic substrate. Such multiple layer structure may be formed through a continuous process or an adhesion process using an adhesive layer. The entire or a portion of the window WD may be flexible.

Figure 4:
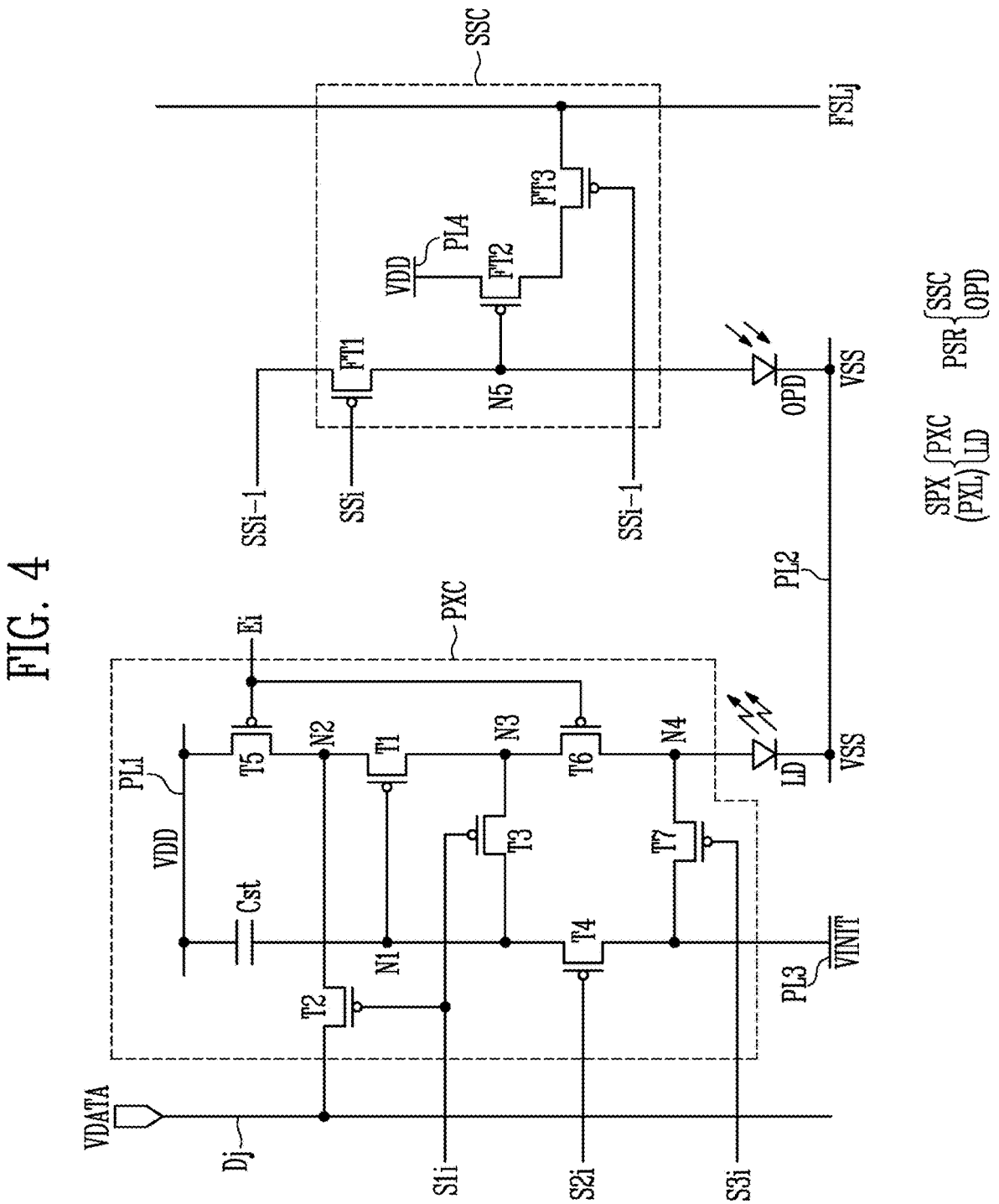
FIG. 4 is a circuit diagram illustrating an example of a sub-pixel and a light sensing pixel included in the display device of FIG. 2.

FIG. 4 is a circuit diagram illustrating an example of the sub-pixel and the light sensing pixel included in the display device of FIG. 2.

In FIG. 4 a sub-pixel SPX (or a pixel PXL) disposed on an i-th pixel row (or an i-th horizontal line) and electrically connected to a j-th data line Dj, and a light sensing pixel PSR disposed on the i-th pixel row and electrically connected to a j-th fingerprint sensing line FSLj (or a readout line) are shown (where, i and j are positive integers).

Referring to FIGS. 1 to 4, the sub-pixel SPX may include a pixel circuit PXC and a light emitting element LD electrically connected thereto, and the light sensing pixel PSR may include a sensor circuit SSC and a light receiving element OPD electrically connected thereto.

One electrode (or an anode electrode) of the light emitting element LD may be electrically connected to a fourth node N4, and another electrode (or a cathode electrode) may be electrically connected to second driving power VSS. The light emitting element LD may generate light of a predetermined luminance in response to a current amount (driving current) supplied from the pixel circuit PXC.

The light emitting element LD may be an organic light emitting diode including an organic light emitting layer. However, an embodiment of the disclosure is not necessarily limited thereto, and the light emitting element LD may be an inorganic light emitting element formed of an inorganic material or a light emitting element formed of an inorganic material and an organic material in combination therewith.

The light receiving element OPD may be an organic photodiode. One electrode (or a first sensor electrode) of the light receiving element OPD may be electrically connected to a fifth node N5, and another electrode (or a second sensor electrode) may be electrically connected to the second driving power VSS. The light receiving element OPD may generate a carrier including a free electron and a hole based on an intensity of light incident to the light receiving layer, and may generate a current (photocurrent) by movement of the carrier.

The pixel circuit PXC may include a first transistor T1, a second transistor T2, a storage capacitor Cst, and the light emitting element LD. In addition, the pixel circuit PXC may further include third to seventh transistors T3 to T7.

A gate electrode of the first transistor T1 (or a driving transistor) may be electrically connected to a first node N1, a first electrode of the first transistor T1 may be electrically connected to a second node N2, and a second electrode of the first transistor T1 may be electrically connected to a third node N3.

The first transistor T1 may control a current amount flowing from first driving power VDD to the second driving power VSS via the light emitting element LD in response to a voltage of the first node N1. To this end, the first driving power VDD may be set to a voltage higher than the second driving power VSS.

The second transistor T2 (or a switching transistor) may be electrically connected between the j-th data line Dj (hereinafter, referred to as a 'data line') electrically connected to the pixel PXL and the second node N2. A gate electrode of the second transistor T2 may be electrically connected to an i-th first scan line S (hereinafter, referred to as a 'first scan line') electrically connected to the pixel PXL. The second transistor T2 may be turned on when a first scan signal is supplied to the first scan line S1$i$ to electrically connect the data line Dj and the second node N2.

The third transistor T3 (or a compensation transistor) may be electrically connected between the second electrode (for example, the third node N3) and the gate electrode (for example, the first node N1) of the first transistor T1. A gate electrode of the third transistor T3 may be electrically connected to the first scan line S1$i$. The third transistor T3 may be turned on when the first scan signal is supplied to the first scan line S1$i$ to electrically connect the second electrode and the gate electrode (or the first node N1 and the third node N3) of the first transistor T1. For example, a timing at which the second electrode of the first transistor T1 and the gate electrode of the first transistor T1 are electrically connected may be controlled by the first scan signal. When the third transistor T3 is turned on, the first transistor T1 may be electrically connected in a diode form.

The fourth transistor T4 (or a first initialization transistor) may be electrically connected between the first node N1 (or the gate electrode of the first transistor T1) and a third power line PL3 to which an initialization voltage VINIT is applied. A gate electrode of the fourth transistor T4 may be electrically connected to an i-th second scan line S2$i$ (hereinafter, referred to as a 'second scan line'). The fourth transistor T4 may be turned on in response to a second scan signal supplied to the second scan line S2$i$ to supply the initialization voltage VINIT to the first node N1. Here, the initialization voltage VINIT may be set to a voltage lower than a data voltage VDATA supplied to the data line Dj. Accordingly, a gate voltage (or the first node N1) of the first transistor T1 may be initialized to the initialization voltage VINT by the turn-on of the fourth transistor T4.

The fifth transistor T5 (or a first emission control transistor) may be electrically connected between a first power line PL1 (or a first driving voltage line) and the second node N2. A gate electrode of the fifth transistor T5 may be electrically connected to an i-th emission control line Ei (hereinafter, referred to as an emission control line). The fifth transistor T5 is turned on when an emission control signal is supplied to the emission control line Ei, and is turned off in other cases.

The sixth transistor T6 (or a second emission control transistor) may be electrically connected between the second electrode (for example, the third node N3) of the first transistor T1 and the fourth node N4. A gate electrode of the sixth transistor T6 may be electrically connected to the emission control line Ei. The sixth transistor T6 may be controlled substantially identically to the fifth transistor T5.

The fifth transistor T5 and the sixth transistor T6 may be turned on in response to the emission control signal supplied through the emission control line Ei, and may form a movement path of the driving current between the first power line PL1 and the fourth node N4 (or between the first power line PL1 and the second power line PL2).

In FIG. 4, the fifth transistor T5 and the sixth transistor T6 are electrically connected to the same emission control line Ei, but this is an example, and the fifth transistor T5 and the sixth transistor T6 may be respectively electrically connected to separate emission control lines to which different emission control signals are supplied.

The seventh transistor T7 (or a second initialization transistor) may be electrically connected between the fourth node N4 and the third power line PL3. A gate electrode of the seventh transistor T7 may be electrically connected to an i-th third scan line S3$i$ (hereinafter, referred to as a 'third scan line'). The seventh transistor T7 may be turned on when a third scan signal is supplied to the third scan line S3$i$ to supply the initialization voltage VINIT to the fourth node N4.

The storage capacitor Cst may be electrically connected between the first power line PL1 and the first node N1. The storage capacitor Cst may store a difference voltage between a voltage of the first driving power VDD by the first power line PL1 and a voltage obtained by subtracting an absolute threshold voltage of the first transistor T1 from a data voltage applied to the first node N1.

In an embodiment, the first scan signal may be supplied after the second scan signal is supplied. For example, the second scan signal and the first scan signal may be supplied with a difference of one horizontal period.

In an embodiment, the third scan signal may be supplied substantially simultaneously with the first scan signal. However, the disclosure is not necessarily limited thereto, and the first scan signal may be supplied after the third scan signal is supplied. For example, a supply interval of the third scan signal and the first scan signal may be one horizontal period. Alternatively, the third scan signal may be supplied after the first scan signal is supplied.

The sensor circuit SSC may include a first sensor transistor FT1, a second sensor transistor FT2, and a third sensor transistor FT3.

The second sensor transistor FT2 and the third sensor transistor FT3 may be disposed between a sensing power line PL4 (or a fourth power line) and a j-th fingerprint sensing line FSLj (hereinafter, referred to as a fingerprint sensing line) in series.

The first sensor transistor FT1 may be electrically connected between an (i–1)-th sensing scan line SSi–1 (hereinafter, referred to as a previous sensing scan line) and the fifth node N5 (or the first electrode of the light receiving element OPD). A gate electrode of the first sensor transistor FT1 may be electrically connected to an i-th sensing scan line SSi (hereinafter, referred to as a sensing scan line). The first sensor transistor FT1 may be turned on by a sensing scan signal supplied to the sensing scan line SSi to supply a voltage supplied to the previous sensing scan line SSi–1 to the fifth node N5. The first sensor transistor FT1 may be used to reset (or initialize) a voltage of the fifth node N5.

A gate electrode of the second sensor transistor FT2 may be electrically connected to the fifth node N5. The second sensor transistor FT2 may generate a sensing current flowing from the sensing power line PL4 to the fingerprint sensing line FSLj based on the voltage of the fifth node N5 by the photocurrent generated by the light receiving element OPD.

In an embodiment, a gate electrode of the third sensor transistor FT3 may be electrically connected to the previous sensing scan line SSi–1. The third sensor transistor FT3 may be turned on when a sensing scan signal is supplied to the previous sensing scan line SSi–1 to electrically connect the second sensor transistor FT2 and the fingerprint sensing line FSLj. Then the sensing signal (sensing current) may be supplied to the fingerprint detector FPDP through the fingerprint sensing line FSLj.

The first to seventh transistors T1 to T7 included in the pixel circuit PXC and the first to third sensor transistors FT1 to FT3 included in the sensor circuit SSC may be P-type transistors (for example, PMOS transistors), but an embodiment of the disclosure is not necessarily limited thereto. For example, at least one of the first to seventh transistors T1 to T7 and the first to third sensor transistors FT1 to FT3 may be implemented as an N-type transistor (for example, an NMOS transistor). When the first to seventh transistors T1 to T7 and the first to third sensor transistors FT1 to FT3 are N-type transistors, positions of a source area (or a source electrode) and a drain area (or a drain electrode) may be reversely changed.

Figure 5:
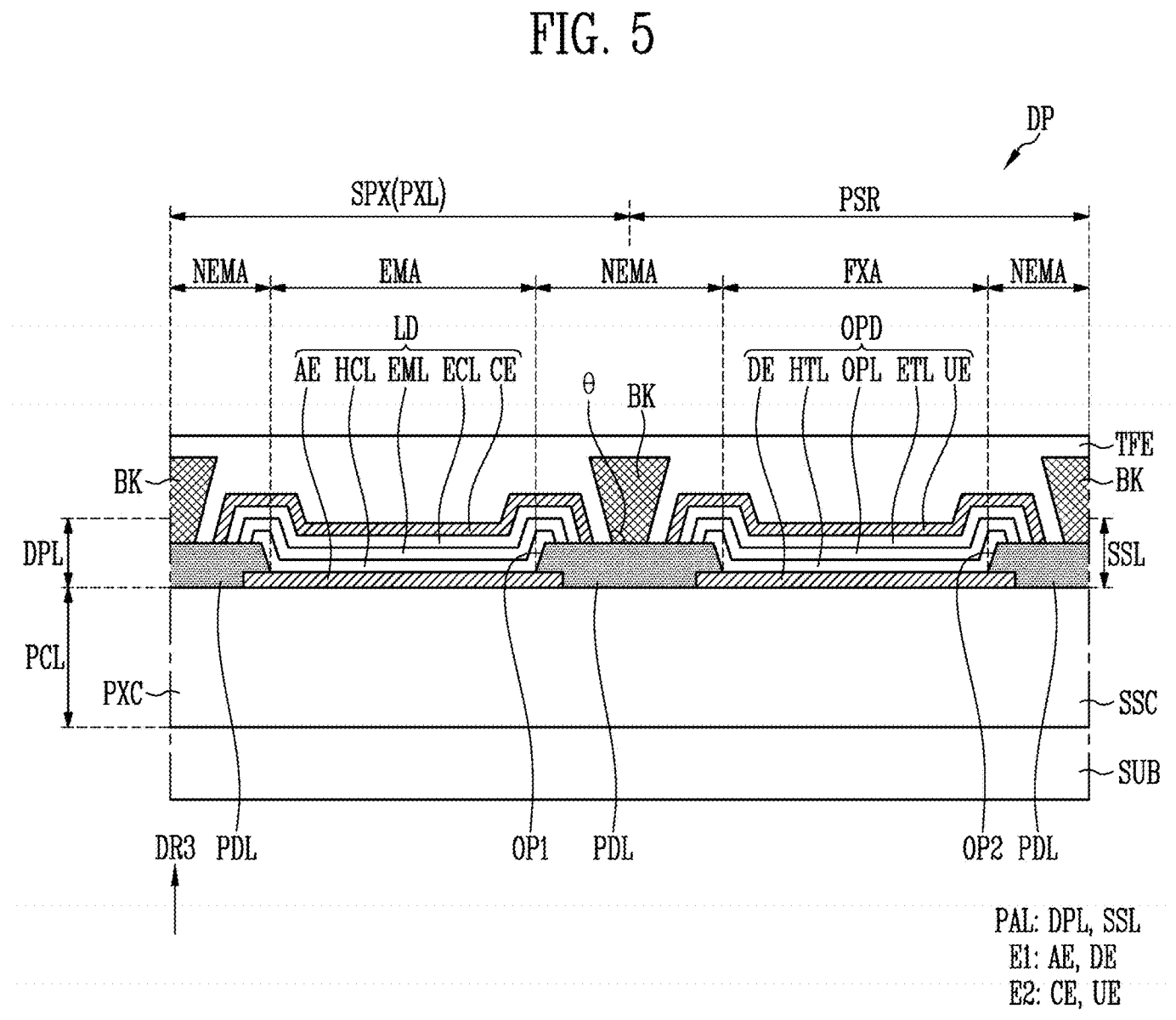

FIG. 5 is an enlarged cross-sectional view of a portion of the display panel included in the display device of FIG. 3.

Referring to FIGS. 1 to 5, the display panel DP may include at least one sub-pixel SPX (or pixel PXL) and at least one light sensing pixel PSR.

The sub-pixel SPX may be disposed in a pixel area included in the display area DA. The pixel area may include a light emitting area EMA and a non-light emitting area NEMA adjacent to the light emitting area EMA. The light sensing pixel PSR may include a light receiving area FXA and the non-light emitting area NEMA adjacent to the light receiving area FXA.

The sub-pixel SPX may include the pixel circuit PXC (or a pixel circuit layer), a display element layer DPL, and a thin film encapsulation layer TFE sequentially disposed on a substrate SUB. The light sensing pixel PSR may include the substrate SUB, and the sensor circuit SSC (or a sensor circuit layer), a sensor layer SSL, and the thin film encapsulation layer TFE sequentially disposed on the substrate SUB.

The pixel circuit PXC included in the sub-pixel SPX and the sensor circuit SSC included in the light sensing pixel PSR may configure the circuit layer PCL, and the display element layer DPL included in the sub-pixel SPX and the sensor layer SSL included in the light sensing pixel PSR may configure the pixel element layer PAL.

The circuit layer PCL corresponding to the sub-pixel SPX may include the pixel circuit PXC disposed on the substrate SUB and signal lines electrically connected to the pixel circuit PXC. In addition, the circuit layer PCL corresponding to the sub-pixel SPX may include at least one insulating layer disposed between configurations included in the pixel circuit PXC.

The display element layer DPL may be formed on the circuit layer PCL (or the pixel circuit PXC) of the sub-pixel SPX. The display element layer DPL may include the light emitting element LD that emits light. The light emitting element LD may include an anode electrode AE, a light emitting layer EML, and a cathode electrode CE.

The anode electrode AE may be electrically connected to the pixel circuit PXC.

The display element layer DPL of the sub-pixel SPX may include a pixel defining layer PDL including a first opening OP1 exposing a portion of the anode electrode AE. The pixel defining layer PDL may be disposed on the anode electrode AE and the circuit layer PCL.

A partition wall BK may be formed on the pixel defining layer PDL.

In an embodiment, the partition wall BK may have a reverse taper shape. For example, as shown in FIG. 5, a lower surface of the partition wall BK may be in contact with at least a partial area of an upper surface of the pixel defining layer PDL, and the cross-sectional area of the partition wall BK may increase as a distance from the pixel defining layer PDL increases along the third direction DR3. For example, the area of the upper surface of the partition wall BK may be greater than the area of the lower surface of the partition wall BK. This "reverse taper" shape may also be thought of as an isosceles trapezoid in which the top base is larger than the bottom base.

In a cross-sectional view of the display panel DP shown in FIG. 5, an angle θ formed by a side surface (or an inclined surface) of the partition wall BK and the lower surface may exceed 90° (for example, θ>90°) (i.e., is an obtuse angle).

As described above, according to embodiments of the disclosure, since the partition wall BK formed on the pixel defining layer PDL has the reverse taper shape, configurations (for example, layers) formed after the partition wall BK is formed may be disposed separately by the partition wall BK even though the configurations (for example, the layers) formed after the partition wall BK is formed are formed using a common mask. For example, even though the configurations (for example, the layers) of the sub-pixel SPX and configurations (for example, layers) of the light sensing pixel PSR formed after the partition wall BK is formed are formed using a common mask, the configurations (for example, the layers) of the sub-pixel SPX and the configurations (for example, the layers) of the light sensing pixel PSR formed after the partition wall BK is formed may be spaced apart from each other by the partition wall BK. Accordingly, when the light sensing pixels PSR sense light reflected by an external object (for example, a user's finger or the like), noise may be minimized. This is more specifically described with reference to FIGS. 9 to 12E.

In addition, the display element layer DPL may include a hole control layer HCL and an electron control layer ECL commonly provided to the light emitting area EMA and the non-light emitting area NEMA. The hole control layer HCL may include a hole transport layer, and may further include a hole injection layer. The hole control layer HCL may be disposed on the anode electrode AE and the pixel defining layer PDL exposed by a first opening OP1 of the pixel defining layer PDL. The light emitting layer EML may be disposed on the hole control layer HCL of the light emitting area EMA. An electron control layer ECL may be disposed on the light emitting layer EML. The electron control layer ECL may include an electron transport layer, and may further include an electron injection layer. The cathode electrode CE may be disposed on the electronic control layer ECL.

The circuit layer PCL corresponding to the light sensing pixel PSR may include a sensor circuit SSC disposed on the substrate SUB and signal lines electrically connected to the sensor circuit SSC. In addition, the circuit layer PCL corresponding to the light sensing pixel PSR may include at least one insulating layer disposed between components included in the sensor circuit SSC.

The sensor layer SSL may be formed on the circuit layer PCL (or the sensor circuit SSC) of the light sensing pixel PSR. The sensor layer SSL may include the light receiving element OPD that receives light. The light receiving element OPD may include a first sensor electrode DE, a light receiving layer OPL, and a second sensor electrode UE.

The first sensor electrode DE may be electrically connected to the sensor circuit SSC. The first sensor electrode DE of the light sensing pixel PSR and the anode electrode AE of the sub-pixel SPX may configure a first electrode layer E1. For example, the first sensor electrode DE and the anode electrode AE may be simultaneously formed of the same material by the same process, but are not necessarily limited thereto.

The sensor layer SSL of the light sensing pixel PSR may include a pixel defining layer PDL including a second opening OP2 exposing a portion of the first sensor electrode DE. The pixel defining layer PDL may be the pixel defining layer PDL of the sub-pixel SPX. The pixel defining layer PDL may be disposed on the first electrode layer E1 and the circuit layer PCL.

In addition, as described above, the partition wall BK may be formed on the pixel defining layer PDL.

In addition, the sensor layer SSL may include a hole transport layer HTL and an electron transport layer ETL commonly provided to the light receiving area FXA and the non-light emitting area NEMA. The hole transport layer HTL may be formed of the same material by the same process as the hole control layer HCL of the sub-pixel SPX. In an embodiment, the hole control layer HCL of the sub-pixel SPX and the hole transport layer HTL of the light sensing pixel PSR formed by the same process may be formed (or disposed) to be separate from each other, by the partition wall BK having the reverse taper shape.

The hole transport layer HTL may be disposed between the first sensor electrode DE and the light receiving layer OPL. The light receiving layer OPL may be disposed on the hole transport layer HTL of the light receiving area FXA. The electron transport layer ETL may be formed of the same material by the same process as the electron control layer ECL of the sub-pixel SPX. In an embodiment, the electron control layer ECL of the sub-pixel SPX and the electron transport layer ETL of the light sensing pixel PSR formed by the same process may be formed (or disposed) to be separate from each other, by the partition wall BK having the reverse taper shape.

The second sensor electrode UE may be disposed on the electron control layer ECL. The second sensor electrode UE of the light sensing pixel PSR and the cathode electrode CE of the sub-pixel SPX may configure a second electrode layer E2.

The cathode electrode CE of the sub-pixel SPX and the second sensor electrode UE of the light sensing pixel PSR may be formed of the same material by the same process. In addition, the cathode electrode CE and the second sensor electrode UE may be electrically connected to the second power line PL2 that transmits a voltage of the second driving power VS S, as shown in FIG. 4.

In an embodiment, the cathode electrode CE of the sub-pixel SPX and the second sensor electrode UE of the light sensing pixel PSR formed by the same process may be formed (or disposed) to be separate from each other, by the partition wall BK having the reverse taper shape.

However, when the cathode electrode CE and the second sensor electrode UE are completely separated, the second sensor electrode UE (or the cathode electrode CE) may be electrically disconnected from the second power line PL2, and thus the second sensor electrode UE (or the cathode electrode CE) might not receive the voltage of the second driving power VS S. Therefore, the cathode electrode CE and the second sensor electrode UE are formed in an interconnected form in a partial area. The partition wall BK may include an opening area at least partially opened on a plane (for example, a first direction axis along the first direction DR1 and a second direction axis along the second direction DR2). This is more specifically described with reference to FIG. 6.

The thin film encapsulation layer TFE may be disposed and/or formed on the display element layer DPL of sub-pixel SPX and the sensor layer SSL of the light sensing pixel PSR.

The thin film encapsulation layer TFE may be formed of a single layer, but may also be formed of multiple layers. The thin film encapsulation layer TFE may include a plurality of insulating layers covering the light emitting element LD and the light receiving element OPD. For example, the thin film encapsulation layer TFE may include at least one inorganic layer and at least one organic layer. For example, the thin film encapsulation layer TFE may have a structure in which an inorganic layer and an organic layer are alternately stacked. The thin film encapsulation layer TFE may be an encapsulation substrate disposed on the light emitting element LD and the light receiving element OPD and bonded to the substrate SUB through a sealant.

Figure 6:
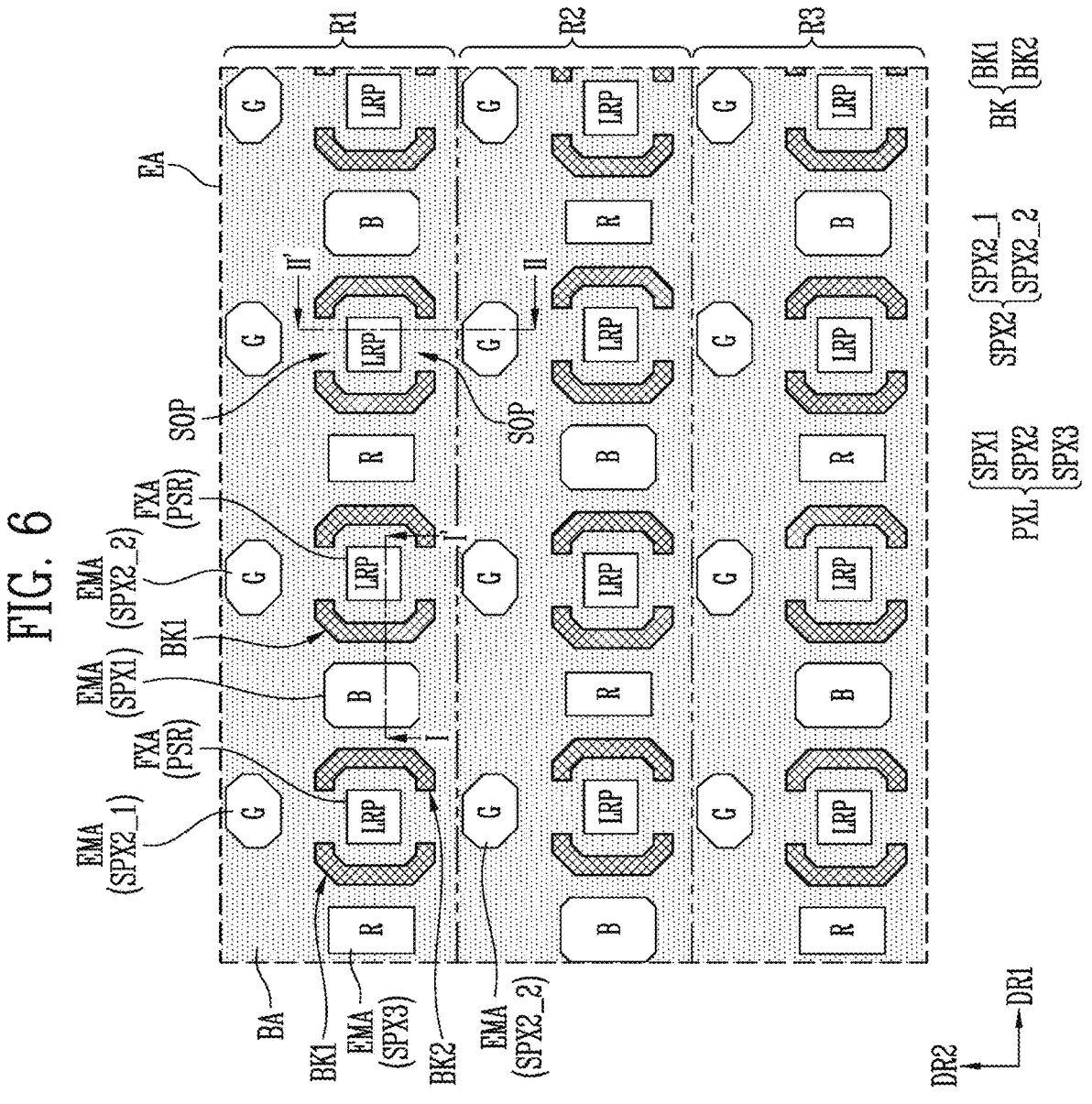
FIG. 6 is an enlarged view illustrating an example of an EA portion of the display device of FIG. 2.
Figure 7:
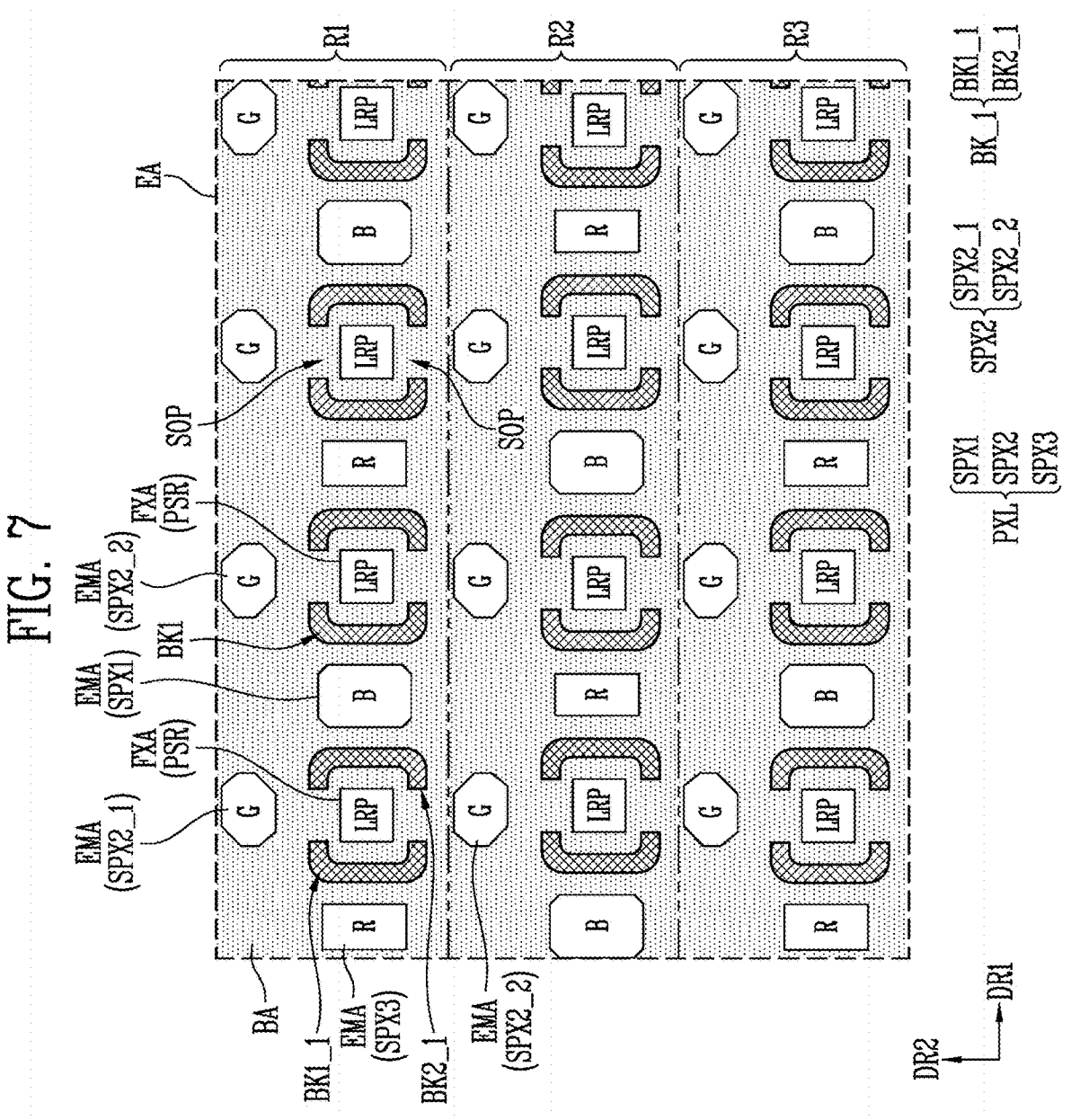
FIG. 7 is an enlarged view illustrating an example of the EA portion of the display device of FIG. 2.
Figure 8:
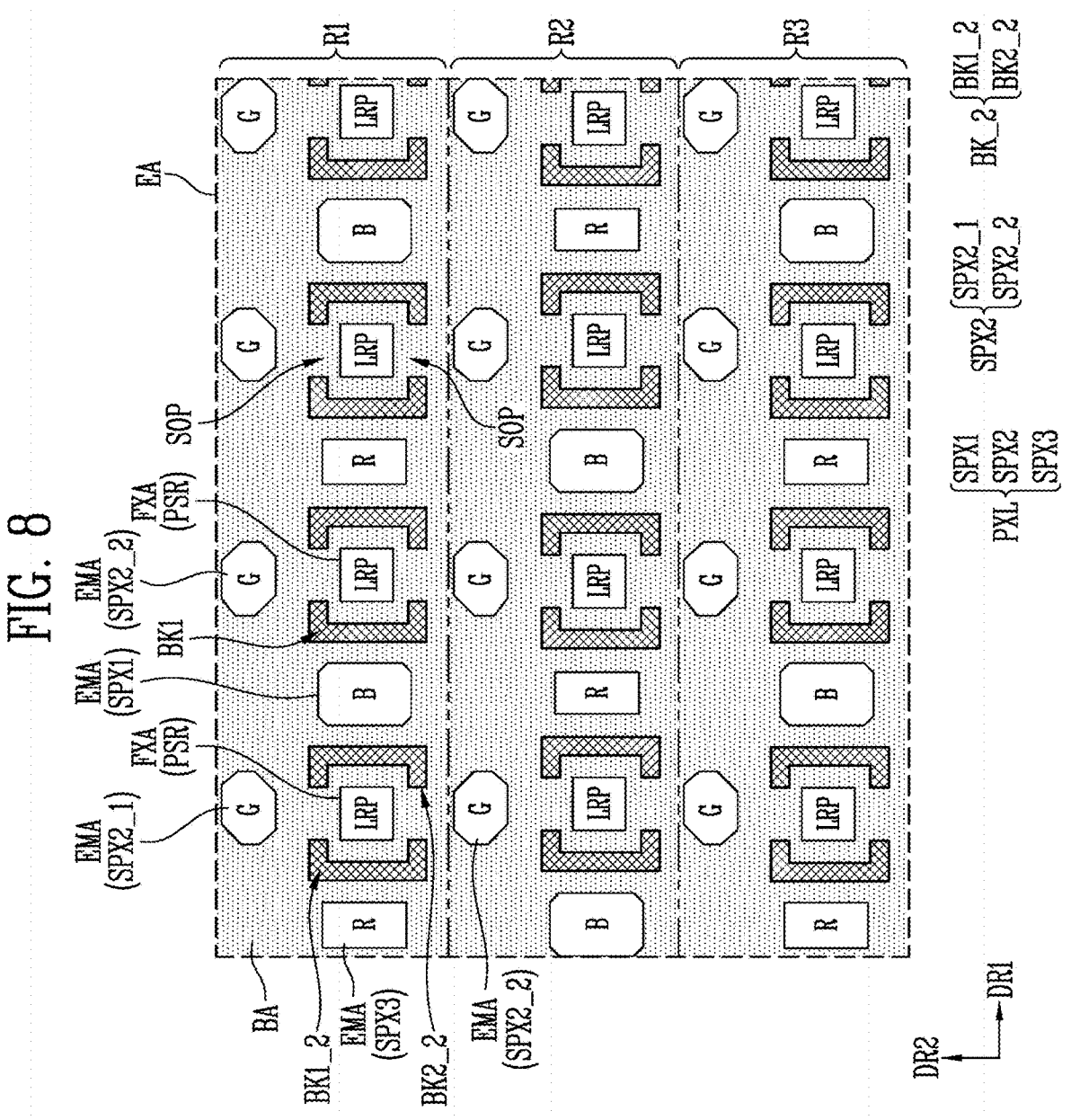
FIG. 8 is an enlarged view illustrating an example of the EA portion of the display device of FIG. 2.

FIG. 6 is an enlarged view illustrating an example of an EA portion of the display device of FIG. 2. FIG. 7 is an enlarged view illustrating an example of the EA portion of the display device of FIG. 2. FIG. 8 is an enlarged view illustrating an example of the EA portion of the display device of FIG. 2.

Referring to FIGS. 2 to 6, in the display area DA (or the sensing area SA) of the display device DD, sub-pixels SPX1, SPX2, and SPX3 (or the pixels PXL) and the light sensing pixels PSR may be disposed.

The first sub-pixel SPX1, the second sub-pixel SPX2, and the third sub-pixel SPX3 may indicate the light emitting area EMA of each sub-pixel, and the light emitting area EMA may be defined by the first opening (for example, the first opening OP1 of FIG. 5) of the pixel defining layer (for example, the pixel defining layer PDL of FIG. 5). In addition, the light sensing pixel PSR may indicate the light receiving area FXA of the light sensing pixel PSR, and the light receiving area may be defined by the second opening (for example, the second opening OP2 of FIG. 5) of the pixel defining layer (for example, the pixel defining layer PDL of FIG. 5).

In FIG. 6, a traverse direction (or a horizontal direction) on a plane is shown as the first direction DR1, and a longitudinal direction (or a vertical direction) on the plane is shown as the second direction DR2.

The sub-pixels SPX1, SPX2, and SPX3 (or the pixels PXL) disposed in the display area DA may be spaced apart from each other. The first sub-pixel SPX1 (or a first pixel), the second sub-pixel SPX2 (or a second pixel), and the third sub-pixel SPX3 (or a third pixel) may emit (or implement) light of different colors, respectively. For example, the first sub-pixel SPX1 may emit a first color light (for example, blue light B), the second sub-pixel SPX2 may emit a second color light (for example, green light G), and the third sub-pixel SPX3 may emit a third color light (for example, red light R). However, this is an example, and emission colors of the sub-pixels SPX1, SPX2, and SPX3 are not necessarily limited thereto.

The second sub-pixels SPX2 may be divided into a (2-1)-th sub-pixel SPX2_1 and a (2-2)-th sub-pixel SPX2_2. For example, the (2-1)-th sub-pixel SPX2_1 and the (2-2)-th sub-pixel SPX2_2 may be alternately disposed along the first direction DR1 in the same pixel row (or the same horizontal line).

In an embodiment, the sub-pixels SPX1, SPX2_1, SPX2_2, and SPX3 may be arranged along the direction DR1 generally in an order of the third sub-pixel SPX3 emitting the red light R, the (2-1)-th sub-pixel SPX2_1 emitting the green light G, the first sub-pixel SPX1 emitting the blue light B, and the (2-2)-th sub-pixel SPX2_2 emitting the green light G in a first pixel row R1 (or a first horizontal line) controlled by the same scan line.

In an embodiment, the light receiving area FXA of the light sensing pixel PSR may be disposed between the light emitting area EMA of the first sub-pixel SPX1 and the light emitting area EMA of the third sub-pixel SPX3. The light receiving area FXA may correspond to the light receiving element OPD (for example, a light receiving unit LRP). Therefore, an arrangement of the light emitting areas EMA of the respective sub-pixels SPX1, SPX2_1, SPX2_2, and SPX3 does not match. For example, the light emitting area EMA of the (2-1)-th sub-pixel SPX2_1 and the light emitting area EMA of the (2-2)-th sub-pixel SPX2_2 may be disposed relatively above the light emitting area EMA of first sub-pixel SPX1 and the light emitting area EMA of the third sub-pixel SPX3.

In an embodiment, the light sensing pixel PSR disposed in the first pixel row R1 may be commonly electrically connected to a scan line electrically connected to the sub-pixels SPX1, SPX2, and SPX3 of the first pixel row R1. However, this is an example, and the light sensing pixel PSR disposed in the first pixel row R1 may be controlled by a signal line different from the scan line electrically connected to the sub-pixels SPX1, SPX2, and SPX3.

In an embodiment, the area of the light receiving areas FXA may be less than the area of each of the light emitting areas EMA. Therefore, image quality reduction due to insertion of the light receiving area FXA may be minimized.

However, this is an example, and positions, areas, shapes, and the like of the light emitting areas EMA and the light receiving areas FXA are not necessarily limited thereto.

In a second pixel row R2 controlled by a second scan line, the sub-pixels SPX1, SPX2_1, SPX2_2, and PX3 may be arranged along the first direction DR1 generally in an order of the third sub-pixel SPX3, the (2-2)-sub-pixel SPX2_2, the first sub-pixel SPX1, and the (2-1)-sub-pixel SPX2_1.

A pixel arrangement of the first pixel row R1 and a pixel arrangement of the second pixel row R2 may be alternately repeated in the second direction DR2 intersecting the first direction DR1. For example, a pixel arrangement of the third pixel row R3 may be substantially the same as the pixel arrangement of the first pixel row R1. However, this is an example, and an arrangement of the sub-pixels SPX1, SPX2_1, SPX2_2, and PX3 is not necessarily limited thereto.

In FIG. 6, the area of the light emitting area EMA of the first sub-pixel SPX1 which is the pixel emitting the blue light B is greater than the areas of the light emitting areas EMA of the second sub-pixel SPX2 and the third sub-pixel SPX3, but the disclosure is not necessarily limited thereto.

In an embodiment, the light sensing pixels PSR may sense light of a wavelength of a band identical to or similar to each other or light of a wavelength of different bands. For example, the light sensing pixels PSR may sense light of a wavelength band corresponding to one of the red light B, the green light G, and the blue light B.

In an embodiment, the light sensing pixel PSR and the light receiving area FXA may be disposed in a ratio of 1:2 with respect to the sub-pixels SPX1, SPX2_1, SPX2_2, and SPX3 and the light emitting area EMA. For example, the third sub-pixel SPX3, the (2-1)-sub-pixel SPX2_1, and one light sensing pixel PSR adjacent thereto may configure a first unit, and the first sub-pixel SPX1, the (2-2)-th sub-pixel SPX2_2, and another light sensing pixel PSR adjacent thereto may configure a second unit.

Therefore, according to an arrangement of the sub-pixels SPX1, SPX2_1, SPX2_2, and SPX3 and the light sensing pixels PSR, each of the first unit and the second unit may be alternately disposed in the first direction DR1 and the second direction DR2.

In an embodiment, a bank area BA by the pixel defining layer (for example, the pixel defining layer PDL of FIG. 5) partitioning each of the light receiving area FXA and the light emitting area EMA may be defined. For example, the bank area BA may include a light absorbing material or a light absorbing agent may be applied to the bank area BA. Therefore, the bank area BA may serve to absorb light input from an outside.

In an embodiment, the partition wall BK may be disposed on the bank area BA.

In an embodiment, the partition wall BK may be disposed in a shape surrounding the light sensing pixel PSR (or the light receiving area FXA) on a plane (for example, on a plane according to the first direction DR1 and the second direction DR2). For example, the partition walls BK may be disposed between the light sensing pixels PSR (or the light receiving areas FXA) and the sub-pixels SPX (or the light emitting areas EMA). Here, since the partition wall BK has the reverse taper shape as described with reference to FIG. 5, even though the configurations (for example, the second electrode layer E2 or the like of FIG. 5) formed after the partition wall BK is formed are formed using the common mask in a manufacturing process, the configurations formed after the partition wall BK may be spaced apart from each other by the partition wall BK.

However, when the second electrode layer (for example, the second electrode layer E2 of FIG. 5) formed as a common electrode layer is completely separated by the partition wall BK, for example, when the second sensor (for example, the second sensor electrode UE of FIG. 5) of the light sensing pixels PSR and the cathode electrode (for example, the cathode electrode CE of FIG. 5) of the sub-pixels SPX are completely separated, the light sensing pixel PSR (for example, the second sensor electrode UE of the light sensing pixel PSR) surrounded by the partition wall BK may be electrically disconnected from the second power line PL2, and thus the light sensing pixel PSR might not obtain the voltage of the second driving power VSS.

Accordingly, the partition wall BK, according to embodiments of the disclosure, may include an opening area at least partially opened on a plane so that the second sensor electrode (for example, the second sensor electrode UE of FIG. 5) of the light sensing pixels PSR and the cathode electrode (for example, the cathode electrode CE of FIG. 5) of the sub-pixels SPX may be formed in an interconnected form. For example, a portion of the partition wall BK may include an end opened to the pixel defining layer (for example, the pixel defining layer PDL of FIG. 5) of the bank area BA.

For example, the partition wall BK may include a first partition wall BK1 and a second partition wall member BK2. The first partition wall BK1 and the second partition wall BK2 may be alternately disposed along the first direction DR1 between the sub-pixels SPX and the light sensing pixel PSR. In addition, the first partition wall BK1 and the second partition wall BK2 may be spaced apart from each other. Accordingly, the partition wall BK may include the opening area SOP partially opened on a plane. In FIG. 6, the partition wall BK includes two opening areas SOP, but an embodiment of the disclosure is not necessarily limited thereto. For example, the partition wall BK may be opened only one side surface on a plan view to include one opening area SOP.

A shape of the partition wall BK may be variously formed. For example, in FIG. 6, the partition wall BK has a substantially hexagonal shape on a plane, but the disclosure is not necessarily limited thereto. For example, referring further to FIGS. 7 and 8, the partition wall BK may have a shape having a gently curved surface on a plane as shown in FIG. 7, or the partition wall BK may have a substantially quadrangular shape on a plane as shown in FIG. 8. However, this is an example, and the partition wall BK according to an embodiment of the disclosure may have various shapes in addition to the shapes shown in FIGS. 6 to 8.

Figure 9:
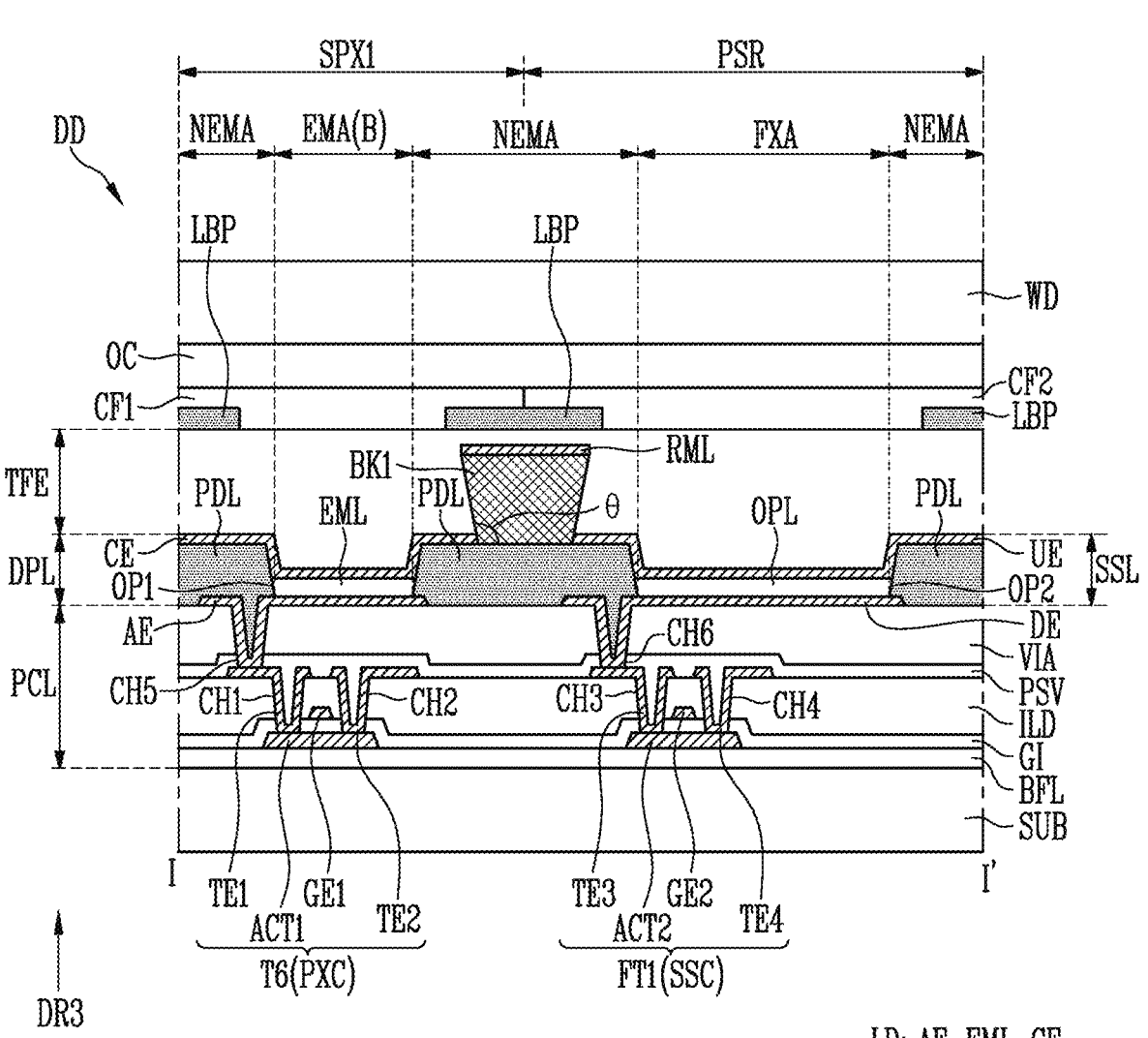
FIG. 9 is a cross-sectional view taken along a line I-I' of FIG. 6.
Figure 10:
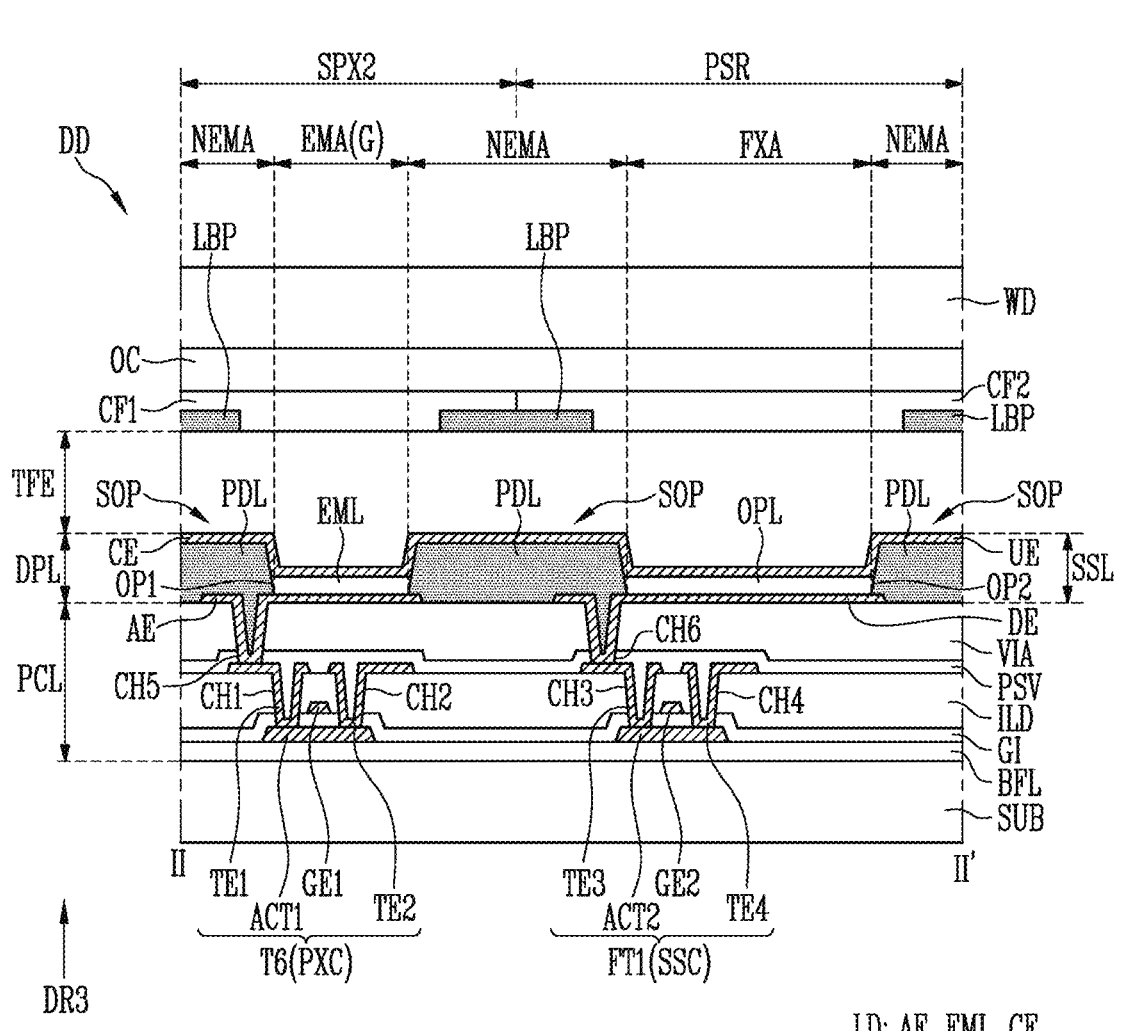
FIG. 10 is a cross-sectional view taken along a line II-IF of FIG. 6

FIG. 9 is a cross-sectional view taken along a line I-I' of FIG. 6. FIG. 10 is a cross-sectional view taken along a line II-IF of FIG. 6.

In FIGS. 9 and 10, "formed and/or disposed on the same layer" may mean formed in the same process, and "formed and/or disposed on different layers" may mean formed in different processes.

In FIGS. 9 and 10, a cross-sectional structure of each sub-pixel is described using the first sub-pixel SPX1 among the sub-pixels SPX1, SPX2, and SPX3 as an example for convenience of description.

In addition, in FIGS. 9 and 10, only a cross-sectional structure of a portion corresponding to the sixth transistor T6 among the first to seventh transistors T1 to T7 shown in FIG. 4 and a cross-sectional structure of a portion corresponding to the first sensor transistor FT1 among the first to third sensor transistors FT1 to FT3 are shown.

In addition, in FIGS. 9 and 10, a longitudinal direction (or a vertical direction) on a cross-section is shown as the third direction DR3.

In FIGS. 9 and 10, in order to avoid an overlapping description, a point different from the above-described embodiments is mainly described. It is to be understood that those elements that are not described in detail with respect to these figures may be at least similar to corresponding elements described elsewhere within the present disclosure.

First, referring to FIGS. 1 to 9, the display device DD may include the first sub-pixel SPX1 and the light sensing pixel PSR disposed on the substrate SUB.

The substrate SUB may include a transparent insulating material to transmit light. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate including a polymer organic material. For example, the flexible substrate may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate.

The circuit layer PCL (for example, the pixel circuit PXC) of the first sub-pixel SPX1 and the circuit layer PCL (for example, the sensor circuit SSC) of the light sensing pixel PSR may be disposed on the substrate SUB. The circuit layer PCL may include a buffer layer BFL, a gate insulating layer GI, an interlayer insulating layer ILD, a passivation layer PSV, and a via layer VIA sequentially stacked on the substrate SUB along the third direction DR3.

The buffer layer BFL may prevent an impurity from diffusing into the sixth transistor T6 included in the pixel circuit PXC and the first sensor transistor FT1 included in the sensor circuit SSC. The buffer layer BFL may be an inorganic insulating layer including an inorganic material. The buffer layer BFL may include a metal oxide such as silicon nitride (SiNx), silicon oxide (SiOx), silicon oxynitride (SiOxNy), and/or aluminum oxide (AlOx). The buffer layer BFL may be provided as a single layer, but may also be provided as multiple layers of at least two layers. When the buffer layer BFL is provided in multiple layers, each layer may be formed of the same material or different materials. The buffer layer BFL may be omitted according to a material, a process condition, and the like of the substrate SUB.

A semiconductor layer (or a semiconductor pattern) including a first active pattern ACT1 and a second active pattern ACT2 may be disposed on the buffer layer BFL. The semiconductor layer may include a polysilicon semiconductor. For example, the semiconductor layer may be formed through a low-temperature poly-silicon process (for example, a low-temperature poly-silicon (LTPS) process). However, the disclosure is not necessarily limited thereto, and at least a portion of the semiconductor layer may be formed of an oxide semiconductor, a metal oxide semiconductor, or the like.

Each of the first and second active patterns ACT1 and ACT2 may include a channel area, a first contact area electrically connected to one end of the channel area, and a second contact area electrically connected to another end of the channel area. The channel area, the first contact area, and the second contact area may be formed of a semiconductor layer that is not doped with an impurity or doped with an impurity. For example, the first contact area and the second contact area may be formed of a semiconductor layer doped with an impurity, and the channel area may be formed of a semiconductor layer that is not doped with an impurity. As an impurity, for example, a p-type impurity may be used, but is not necessarily limited thereto. One of the first and second contact areas may be a source area, and the other may be a drain area.

The gate insulating layer GI may be disposed and/or formed entirely on the first and second active patterns ACT1 and ACT2 and the buffer layer BFL.

The gate insulating layer GI may be an inorganic layer (or an inorganic insulating layer) including an inorganic material. For example, the gate insulating layer GI may include a metal oxide such as silicon nitride (SiNx), silicon oxide (SiOx), silicon oxynitride (SiOxNy), and/or aluminum oxide (AlOx). However, a material of the gate insulating layer GI is not necessarily limited to the above-described embodiments. According to an embodiment, the gate insulating layer GI may be formed of an organic layer (or an organic insulating layer) including an organic material. The gate insulating layer GI may be provided as a single layer, but may also be provided as multiple layers of at least two layers.

A first gate electrode GE1 and a second gate electrode GE2 may be disposed and/or formed on the gate insulating layer GI. The first gate electrode GE1 may be disposed and/or formed on the gate insulating layer GI to correspond to the channel area of the first active pattern ACT1, and the second gate electrode GE2 may be disposed and/or formed on the gate insulating layer GI to correspond to the channel area of the second active pattern ACT2. The first and second gate electrodes GE1 and GE2 may be formed as a single layer with copper (Cu), molybdenum (Mo), tungsten (W), aluminum neodymium (AlNd), titanium (Ti), and aluminum (Al), and/or silver (Ag) in alone or combination, or may be formed as double layers or multiple layers of molybdenum (Mo), titanium (Ti), copper (Cu), aluminum (Al), and/or silver (Ag), which is a low-resistance material, in order to reduce a line resistance.

The interlayer insulating layer ILD may be disposed and/or formed entirely on the first and second gate electrodes GE1 and GE2 and the gate insulating layer GI.

The interlayer insulating layer ILD may include a same material as the gate insulating layer GI, or may include one or more materials from the materials exemplified as a configuration material of the gate insulating layer GI.

First, second, third, and fourth connections TE1, TE2, TE3, and TE4 may be disposed and/or formed on the interlayer insulating layer ILD.

The first, second, third, and fourth connections TE1, TE2, TE3, and TE4 may be spaced apart from each other on the interlayer insulating layer ILD.

The first connection TE1 may contact the first contact area of one end of the first active pattern ACT1 through a first contact hole CH1 formed in the interlayer insulating layer ILD and the gate insulating layer GI. When the first contact area is a source area, the first connection TE1 may be a first source electrode.

The second connection TE2 may contact the second contact area of the other end of the first active pattern ACT1 through a second contact hole CH2 formed in the interlayer insulating layer ILD and the gate insulating layer GI. When the second contact area is a drain area, the second connection TE2 may be a first drain electrode.

The third connection TE3 may contact the first contact area at one end of the second active pattern ACT2 through a third contact hole CH3 formed in the interlayer insulating layer ILD and the gate insulating layer GI. When the first contact area is a source area, the third connection TE3 may be a second source electrode.

The fourth connection TE4 may contact the second contact area of the other end of the second active pattern ACT2 through a fourth contact hole CH4 formed in the interlayer insulating layer ILD and the gate insulating layer GI. When the second contact area is a drain area, the fourth connection TE4 may be a second drain electrode.

The first to fourth connections TE1 to TE4 may include the same material as the first and second gate electrodes GE1 and GE2 or may include one or more materials from the materials exemplified as a configuration material of the first and second gate electrodes GE1 and GE2.

The passivation layer PSV may be disposed and/or formed entirely on the first to fourth connections TE1 to TE4 and the interlayer insulating layer ILD.

The passivation layer PSV (or a protective layer) may be an inorganic layer (or an inorganic insulating layer) including an inorganic material or an organic layer (or an organic insulating layer) including an organic material. The inorganic layer may include, for example, a metal oxide such as silicon oxide (SiOx), silicon nitride (SiNx), silicon oxynitride (SiOxNy), and/or aluminum oxide (AlOx). The organic layer may include, for example, acrylic resin (polyacrylates resin), epoxy resin, phenolic resin, polyamides resin, polyimide resin, unsaturated polyesters resin, poly-phenylen ethers resin, poly-phenylene sulfides resin, and/or benzocyclobutene resin.

The passivation layer PSV may include the same material as the interlayer insulating layer ILD, but is not necessarily limited thereto. The passivation layer PSV may be provided as a single layer, but may also be provided as multiple layers of at least two layers.

The passivation layer PSV may be partially opened to include a fifth contact hole CH5 exposing one area of the first connection TE1 and a sixth contact hole CH6 exposing one area of the third connection TE3.

The via layer VIA may be disposed and/or formed entirely on the passivation layer PSV.

The via layer VIA may be partially opened to include fifth and sixth contact holes CH5 and CH6 respectively corresponding to the fifth and sixth contact holes CH5 and CH6 of the passivation layer PSV. The via layer VIA may include the same material as the passivation layer PSV or may include one or more materials from the materials exemplified as a configuration material of the passivation layer PSV. In an embodiment, the via layer VIA may be an organic layer formed of an organic material.

In FIG. 9, the via layer VIA is disposed on the passivation layer PSV, but is not necessarily limited thereto. According to an embodiment, one layer of the passivation layer PSV and the via layer VIA may be omitted.

A pixel element layer PAL may be disposed on the circuit layer PCL. For example, the display element layer DPL may be disposed and/or formed on the circuit layer PCL (for example, the pixel circuit PXC) of the first sub-pixel SPX1, and the sensor layer SSL may be disposed and/or formed on the circuit layer PCL (for example, the sensor circuit SSC) of the light sensing pixel PSR.

The display element layer DPL may include the light emitting element LD and the pixel defining layer PDL. The light emitting element LD may include the anode electrode AE (or a first pixel electrode), the light emitting layer EML, and the cathode electrode CE (or a second pixel electrode). The light emitting element LD may be electrically connected to the sixth transistor T6 of the pixel circuit PXC.

The sensor layer SSL may include the light receiving element OPD and the pixel defining layer PDL. The light receiving element OPD may be an optical method of fingerprint sensor. For example, the light receiving element OPD may be formed of a photo diode, a CMOS image sensor, a CCD camera, a photo transistor, or the like, but is not necessarily limited thereto. The light receiving element OPD may recognize a fingerprint by sensing light reflected by an external object (for example, a user's finger or the like). For example, when a user's finger touches the window WD, light output from the light emitting element LD (or the light emitting layer EML) may be reflected by a ridge or a valley of the finger, and the reflected light may reach the light receiving element OPD (or the light receiving layer OPL) of the sensor layer SSL. The light receiving element OPD may recognize a pattern of the user's fingerprint by distinguishing the light reflected from the ridge of the finger and the light reflected from the valley of the finger.

The light receiving element OPD may be electrically connected to the first sensor transistor FT1 of the sensor circuit SSC. The light receiving element OPD may include the first sensor electrode DE, the light receiving layer OPL (or a photoelectric conversion layer), and the second sensor electrode UE.

The anode electrode AE and the first sensor electrode (DE) may be formed of a metal layer of Ag, Mg, Al, Pt, Pd, Au, Ni, Nd, Ir, Cr, an alloy thereof, and the like, indium tin oxide (ITO), indium zinc oxide (IZO), zinc oxide (ZnOx), indium tin zinc oxide (ITZO), and/or the like. The anode electrode AE may be electrically connected to the sixth transistor T6 through the fifth contact hole CH5 formed in the via layer VIA and the passivation layer PSV. The first sensor electrode DE may be electrically connected to the first sensor transistor FT1 through the sixth contact hole CH6 formed in the via layer VIA and the passivation layer PSV.

The anode electrode AE of the first sub-pixel SPX1 and the first sensor electrode DE of the light sensing pixel PSR may configure the first electrode layer E1. For example, the anode electrode AE and the first sensor electrode DE may be simultaneously formed by the same process using a mask, but the disclosure is not necessarily limited thereto.

The pixel defining layer PDL (or a bank) may be disposed and/or formed entirely on the anode electrode AE, the first sensor electrode DE, and the via layer VIA.

The pixel defining layer PDL may define (or partition) the light emitting area EMA of the first sub-pixel SPX1 and the light receiving area FXA of the light sensing pixel PSR. The pixel defining layer PDL may be an organic insulating layer formed of an organic material. The organic material may include an acrylic resin, an epoxy resin, a phenolic resin, a polyamide resin, a polyimide resin, and the like.

According to an embodiment, the pixel defining layer PDL may include a light absorbing material or a light absorbing agent may be applied to the pixel defining layer PDL. Therefore, the pixel defining layer PDL may serve to absorb light input from the outside. For example, the pixel defining layer PDL may include a carbon-based black pigment. However, the disclosure is not necessarily limited thereto, and the pixel defining layer PDL may include an opaque metal material such as chromium (Cr), molybdenum (Mo), an alloy (MoTi) of molybdenum (Mo) and titanium (Ti), tungsten (W), vanadium (V), niobium (Nb), tantalum (Ta), manganese (Mn), cobalt (Co), and/or nickel (Ni) having a high light absorption factor.

The pixel defining layer PDL may include a first opening OP1 exposing one area (for example, a portion of an upper surface) of the anode electrode AE and a second opening OP2 exposing one area (for example, a portion of an upper surface) of the first sensor electrode DE, and may protrude in the third direction DR3 from the via layer VIA along a perimeter of the light emitting area EMA and the light receiving area FXA.

The first opening OP1 of the pixel defining layer PDL may correspond to the light emitting area EMA, and the second opening OP2 of the pixel defining layer PDL may correspond to the light receiving area FXA. The pixel defining layer PDL may be patterned to include the first opening OP1 of a polygon (for example, a quadrilateral, a hexagon, or the like) so that the light emitting area EMA of the first sub-pixel SPX1 has a planar shape of a polygon (for example, quadrilateral, hexagon, or the like) in a process using a mask. In addition, the pixel defining layer PDL may be patterned to include the second opening OP2 of a quadrilateral (for example, a rectangle, a square, or the like) so that the light receiving area FXA of the light sensing pixel PSR has a planar shape of a quadrilateral (for example, a rectangle, a square, or the like) in the above-described process.

In an embodiment, the partition wall (for example, the first partition wall BK1) may be formed on the pixel defining layer PDL.

In an embodiment, as described with reference to FIG. 5, the first partition wall BK1 may have the reverse taper shape.

The first partition wall BK1 may include substantially the same material as the pixel defining layer PDL. For example, the first partition wall BK1 may be an organic insulating layer formed of an organic material. The organic material may include an acrylic resin, an epoxy resin, a phenolic resin, a polyamide resin, a polyimide resin, and the like.

The first partition wall BK1 may include a light absorbing material or a light absorbing agent may be applied to the first partition wall BK1. Therefore, the first partition wall BK1 may serve to absorb light input from the outside. For example, the first partition wall BK1 may include a carbon-based black pigment. However, the disclosure is not necessarily limited thereto, and the first partition wall BK1 may include an opaque metal material such as chromium (Cr), molybdenum (Mo), an alloy (MoTi) of molybdenum (Mo) and titanium (Ti), tungsten (W), vanadium (V), niobium (Nb), tantalum (Ta), manganese (Mn), cobalt (Co), and/or nickel (Ni) having a high light absorption factor.

The light emitting layer EML may be disposed and/or formed on the anode electrode AE exposed by the first opening OP1 of the pixel defining layer PDL. The light emitting layer EML may include an organic material to emit light of a predetermined color (for example, blue light B). For example, the light emitting layer EML may include a hole transport layer, an organic material layer, and an electron transport layer.

The light receiving layer OPL may be disposed and/or formed on the first sensor electrode DE exposed by the second opening OP2 of the pixel defining layer PDL. The light receiving layer OPL may serve to detect and absorb light reflected or scattered from the fingerprint of the user's finger. At this time, the light receiving layer OPL may recognize the fingerprint by sensing a difference of an amount of light reflected or scattered and absorbed from the ridge or the valley of the fingerprint of the user's finger. A hole and an electron generated by absorbing light by the light receiving layer OPL may be transmitted to the cathode electrode CE and the second sensor electrode UE, respectively.

The light receiving layer OPL may be formed of an organic photosensitive material. For example, the organic photosensitive material may include a dithiolene-based material (BDN) (bis(4-dimethylaminodithiobenzyl)nickel (II)), a benzotriazole-based high molecular compound (PTZBTTT-BDT), a porphyrin-based small molecule material (DHTBTEZP), and the like, but is not necessarily limited thereto.

The electron transport layer may be disposed on the light emitting layer EML and the light receiving layer OPL.

The cathode electrode CE may be disposed and/or formed on the light emitting layer EML of the first sub-pixel SPX1, and the second sensor electrode UE may be disposed and/or formed on the light receiving layer OPL of the light sensing pixel PSR.

The cathode electrode CE of the first sub-pixel SPX1 and the second sensor electrode UE of the light sensing pixel PSR may configure the second electrode layer E2. In an embodiment, the cathode electrode CE and the second sensor electrode UE may be a common electrode (for example, the second electrode layer E2) integrally formed in the display area DA. The voltage of the second driving power VSS may be supplied to the cathode electrode CE and the second sensor electrode UE.

The cathode electrode CE and the second sensor electrode UE may be formed of a metal layer of Ag, Mg, Al, Pt, Pd, Au, Ni, Nd, Ir, Cr, and the like, and/or a transparent conductive layer of ITO, IZO, ZnO, ITZO, and the like. In an embodiment, the cathode electrode CE and the second sensor electrode UE may be formed of multiple layers including two or more layers including a metal thin layer, and may be formed of for example, three layers of ITO/Ag/ITO.

Even in a process of using a common mask when the second electrode layer E2 is formed, as shown in FIG. 9, the cathode electrode CE of the first sub-pixel SPX1 and the second sensor electrode UE of the light sensing pixel PSR may be spaced apart from each other by the first partition wall BK1 having the reverse taper shape. For example, in the cross-sectional view shown in FIG. 9, since an angle θ formed by a side surface (or an inclined surface) and a lower surface of the first partition wall BK1 is greater than 90° (for example, an obtuse angle where θ>90°), a phenomenon in which the second electrode layer E2 might not be electrically connected to each other and may be electrically disconnected may occur according to a step coverage. For example, when the second electrode layer E2 is formed, the second electrode layer E2 may dig from the side surface of the first partition wall BK1 having the reverse taper shape to a lower area, might not be deposited, may be separated (or disconnected), may be disposed and/or deposited. Accordingly, even though the second electrode layer E2 is formed through the process using the common mask without a separate patterning process, the second electrode layer E2 may be disposed separately by the first partition wall BK1 having the reverse taper shape. For example, the cathode electrode CE of the first sub-pixel SPX1 and the second sensor electrode UE of the light sensing pixel PSR may be spaced apart from each other. A portion of the second electrode layer E2 may be deposited and disposed on the first partition wall BK1. For example, a dummy layer RML that is a portion of the second electrode layer E2 may be disposed on the first partition wall BK1 by a process of forming the second electrode layer E2.

As the cathode electrode CE of the first sub-pixel SPX1 and the second sensor electrode UE of the light sensing pixel PSR are spaced apart from each other, since a current leakage phenomenon in which a current flows from the cathode electrode CE to the second sensor electrode UE is reduced (or eliminated), noise may be minimized when the light sensing pixel PSR senses the light reflected by the external object (for example, the user's finger or the like) to recognize the pattern of the user's fingerprint.

As the angle θ formed by the side surface (or the inclined surface) and the lower surface of the first partition wall BK1 increases, since a tendency in which the second electrode layer E2 is spaced apart from the first partition wall BK1 becomes stronger, noise reduction effect may be maximized.

In addition, since the cathode electrode CE of the first sub-pixel SPX1 and the second sensor the electrodes UE of the light sensing pixel PSR may be deposited separately from each other in a manufacturing process using a common mask by the partition wall BK without using a separate patterning process, a manufacturing process time may be shortened, and a process cost may be reduced.

In addition, since the partition wall BK is further disposed on the pixel defining layer PDL, an optical path allowing the light emitted from the light emitting element LD to proceed to an upper portion of the display device DD without directly proceeding to the light receiving element OPD. Accordingly, since the light sensing pixel PSR might not directly receive the light emitted from the light emitting element LD, and may sense the light emitted from the light emitting element LD and reflected by the external object (for example, the user's finger), accuracy in recognizing the pattern of the user's fingerprint by the light sensing pixel may be increased.

However, as described with reference to FIGS. 5 to 8, the first partition wall BK1 may include an opening area at least partially opened on a plane (for example, a plane according to the first direction DR1 and the second direction DR2 of FIG. 6), and thus the cathode electrode CE and the second sensor electrode UE may be formed in an interconnected form in a partial area.

For example, referring further to FIG. 10, a partition wall might not be disposed on the pixel defining layer PDL corresponding to the opening areas SOP described with reference to FIG. 6. For example, as described with reference to FIG. 6, the partition wall (for example, the partition wall BK of FIG. 6) may include the opening area SOP that is at least partially opened on a plane. Accordingly, the second sensor electrode UE may be electrically connected to the cathode electrode CE to receive the voltage of the second driving power VSS through the second power line PL2.

A distance of the opening area SOP of the partition wall BK (for example, a distance along the first direction DR1 of the opening area SOP of FIG. 6) is minimized to prevent current leakage. For example, in FIG. 6, the distance along the first direction DR1 of the opening area SOP may be narrower a distance along the first direction DR1 of the second sub-pixel SPX2 adjacent to the opening area SOP along the second direction DR2. However, this is merely an example, and the distance of the opening area SOP of the partition wall BK may be variously set.

Referring to FIG. 9 again, the thin film encapsulation layer TFE may be disposed and/or formed entirely on the cathode electrode CE, the second sensor electrode UE, and the dummy layer RML.

Since the thin film encapsulation layer TFE corresponds to the same configuration as the thin film encapsulation layer TFE described with reference to FIG. 5, it may be assumed that to the extent that an element is not described in detail herein, that element may be at least similar to a corresponding element that has been described elsewhere within the present disclosure.

A light blocking pattern LBP may be disposed and/or formed on the thin film encapsulation layer TFE to correspond to the non-light emitting area NEMA of the first sub-pixel SPX1 and the non-light emitting area NEMA of the light sensing pixel PSR.

The light blocking pattern LBP may include a light blocking material that prevents a light leakage defect in which light (or rays) is leaked between the first sub-pixel SPX1 and a sub-pixel adjacent thereto. For example, the light blocking pattern LBP may include a black matrix, but is not necessarily limited thereto. According to an embodiment, the light blocking pattern LBP may include carbon black (CB) and/or titanium black (TiBK). In addition, the light blocking pattern LBP may prevent color mixing of light emitted from each of the first sub-pixel SPX1 and the sub-pixels adjacent thereto.

In the first sub-pixel SPX1, the light blocking pattern LBP may be partially opened so as not to overlap the light emitting area EMA. The opening of the light blocking pattern LBP may provide an optical path so that the light emitted from the light emitting element LD may proceed to an upper portion of the display device DD. To this end, the opening of the light blocking pattern LBP may overlap the light emitting element LD (or the light emitting area EMA).

In the first light sensing pixel PSR1, the light blocking pattern LBP may be partially opened so as not to overlap the light receiving area FXA. The opening of the light blocking pattern LBP may provide an optical path so that the light reflected from the fingerprint of the user's finger may proceed to the light receiving element OPD. To this end, the opening of the light blocking pattern LBP may overlap the light receiving element OPD (or the light receiving area FXA).

Color filters CF1 and CF2 may be disposed on the light blocking pattern LBP and the thin film encapsulation layer TFE.

The color filters CF1 and CF2 may include a first color filter CF1 disposed on at least one surface of the light blocking pattern LBP and the thin film encapsulation layer TFE of the first sub-pixel SPX1 and a second color filter CF2 disposed on at least one surface of the light blocking pattern LBP and the thin film encapsulation layer TFE of the light sensing pixel PSR. Hereinafter, the light blocking pattern LBP of the first sub-pixel SPX1 is referred to as a first light blocking pattern, and the light blocking pattern LBP of the light sensing pixel PSR is referred to as a second light blocking pattern.

The first color filter CF1 may be disposed in the opening of the first blocking pattern LBP to directly contact the thin film encapsulation layer TFE exposed through the opening of the first blocking pattern LBP. The first color filter CF1 may overlap the light emitting element LD (or the light emitting area EMA). For convenience of description, only the first sub-pixel SPX1 is shown in FIG. 9, and the first color filter CF1 may be a blue color filter. The first color filter CF1 may further include each of a green color filter overlapping the light emitting area EMA of the second sub-pixel SPX2 and a red color filter overlapping the light emitting area EMA of the third sub-pixel SPX3. For example, in FIG. 10, the first color filter CF1 overlapping the light emitting area EMA of the second sub-pixel SPX2 may include the green color filter.

The second color filter CF2 may be disposed in the opening of the second light blocking pattern LBP to directly contact the thin film encapsulation layer TFE exposed through the opening of the second light blocking pattern LBP. The second color filter CF2 may overlap the light receiving element OPD (or the light receiving area FXA). The second color filter CF2 may include one of a red color filter, a green color filter, and a blue color filter according to a color light sensed by the light receiving layer OPL. For example, when the light receiving layer OPL absorbs light of a green wavelength band, the second color filter CF2 may be a green filter. For example, the second color filter CF2 may be set regardless of an emission color of the adjacent sub-pixels SPX1, SPX2, and SPX3.

The above-described light blocking pattern LBP and color filters CF1 and CF2 may be used as an anti-reflection layer that blocks external light reflection. Since the display device DD (or the display panel DP) includes the light blocking pattern LBP and the color filters CF1 and CF2 used as the anti-reflection layer, a separate polarization layer might not be disposed. Accordingly, a luminance may be prevented from being reduced and a thickness of the display device DD may be minimized.

In addition, since the light receiving element OPD is formed on the same layer as the light emitting element LD, the thickness of the display device DD may be further reduced. In addition, since an incident amount of external light to the light receiving element OPD is increased, light sensing performance may be increased. In addition, since the sensor circuit SSC is simultaneously formed during a manufacturing process of the pixel circuit PXC and the light receiving element OPD is simultaneously formed during a manufacturing process of the light emitting element LD, a process time and a manufacturing cost of the display device DD may be reduced.

A planarization layer OC may be further disposed between the first and second color filters CF1 and CF2 and the window WD. The planarization layer OC may serve to planarize a step difference due to configurations disposed thereunder. The planarization layer OC may be an organic layer. The organic layer may include an acrylic resin, an epoxy resin, a phenolic resin, a polyamide resin, or a polyimide resin, but is not necessarily limited to.

Figure 11:
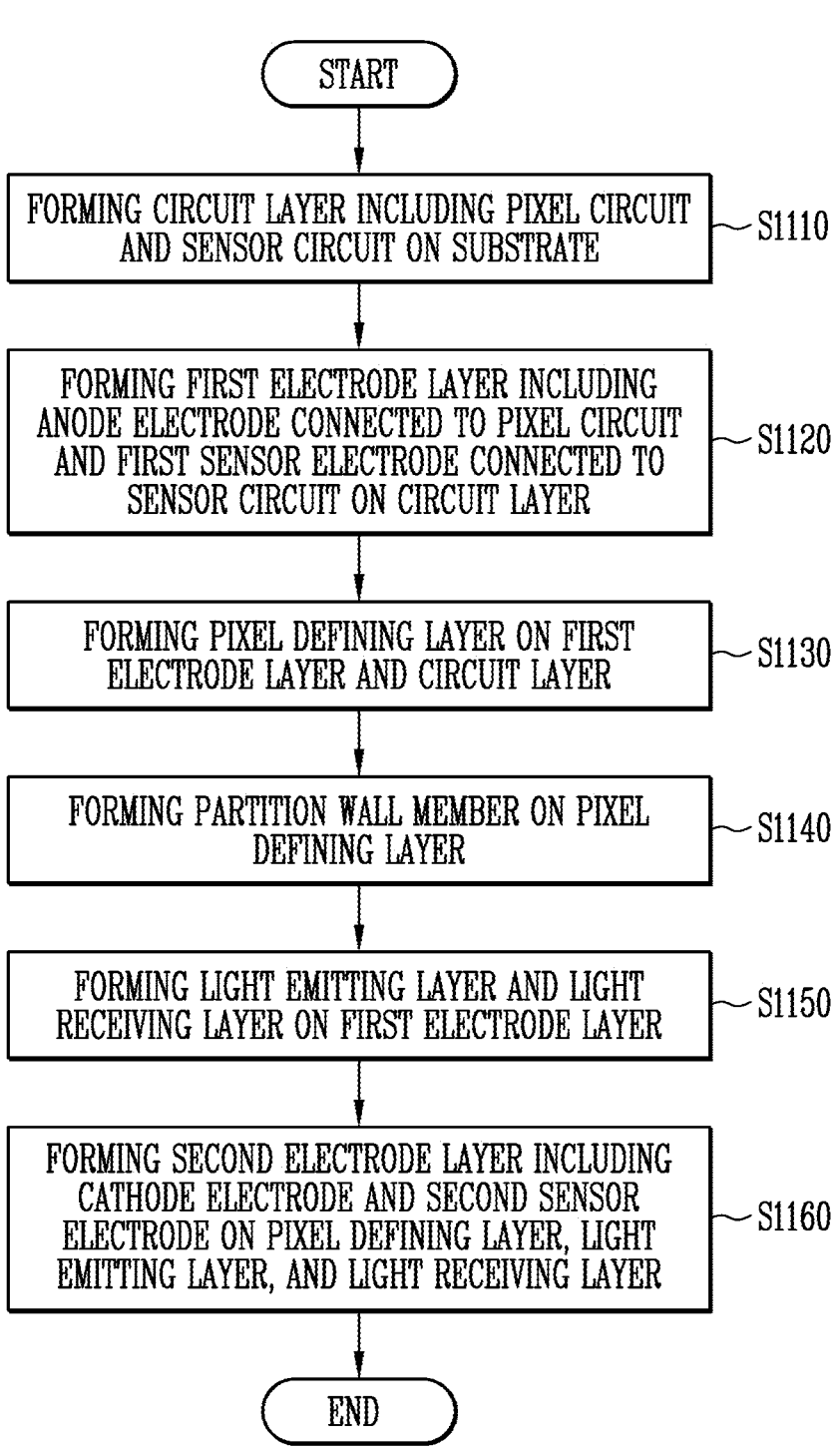
FIG. 11 is a flowchart illustrating a method of manufacturing a display device according to embodiments of the disclosure.

FIG. 11 is a flowchart illustrating a method of manufacturing a display device according to embodiments of the disclosure. FIGS. 12A to 12E are cross-sectional views illustrating the method of manufacturing the display device of FIG. 11. It may be assumed that to the extent that an element is not described in detail herein, that element may be at least similar to a corresponding element that has been described elsewhere within the present disclosure.

Referring to FIG. 11, the method of manufacturing the display device according to embodiments of the disclosure may include forming a circuit layer including a pixel circuit and a sensor circuit on a substrate (S1110), forming a first electrode layer including an anode electrode electrically connected to the pixel circuit and a first sensor electrode electrically connected to the sensor circuit on the circuit layer (S1120), forming a pixel defining layer on the first electrode layer and the circuit layer (S1130), forming a partition wall on the pixel defining layer (S1140), forming a light emitting layer and a light receiving layer on the first electrode layer (S1150), and forming a second electrode layer including a cathode electrode and a second sensor electrode on the pixel defining layer, the light emitting layer, and the light receiving layer (S1160).

Figure 12A:
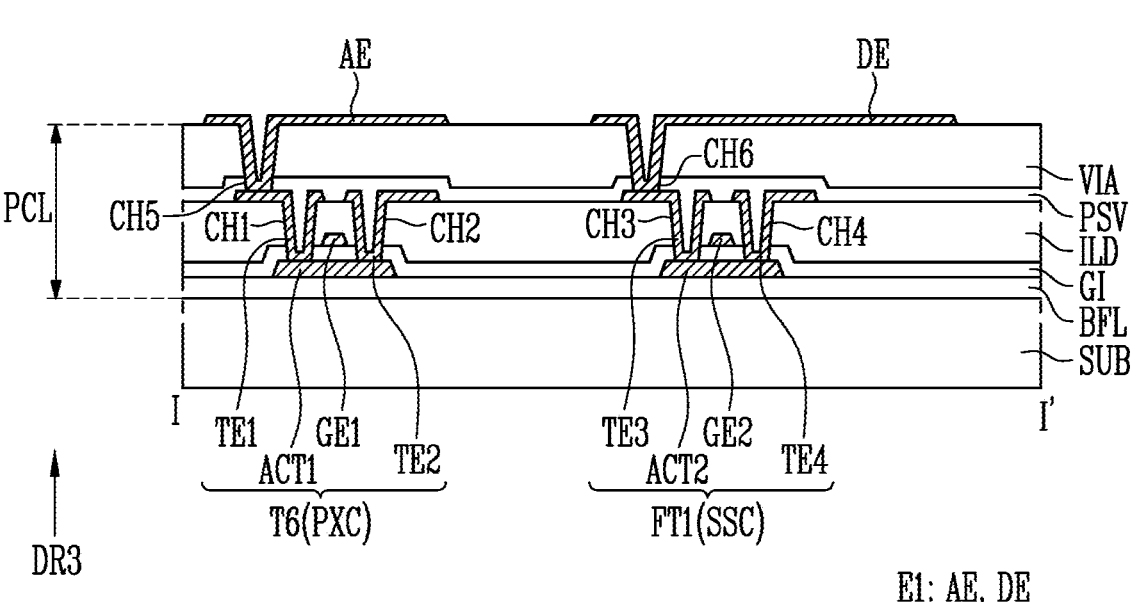
FIGS. 12A to 12E are cross-sectional views illustrating the method of manufacturing the display device of FIG. 11.

First, further referring to FIG. 12A, the method of manufacturing the display device may include forming the circuit layer PCL including the pixel circuit PXC and the sensor circuit SSC on the substrate SUB (S1110). Here, the circuit layer PCL may be the circuit layer PCL described with reference to FIGS. 5 and 9.

Thereafter, the method of manufacturing the display device may include forming the first electrode layer E1 including the anode electrode AE electrically connected to the pixel circuit PXC and the first sensor electrode DE electrically connected to the sensor circuit SSC on the circuit layer PCL (S1120). For example, as described with reference to FIGS. 5 and 9, the method of manufacturing the display device may include forming the first electrode layer E1 through the same process with the same material.

Figure 12B:
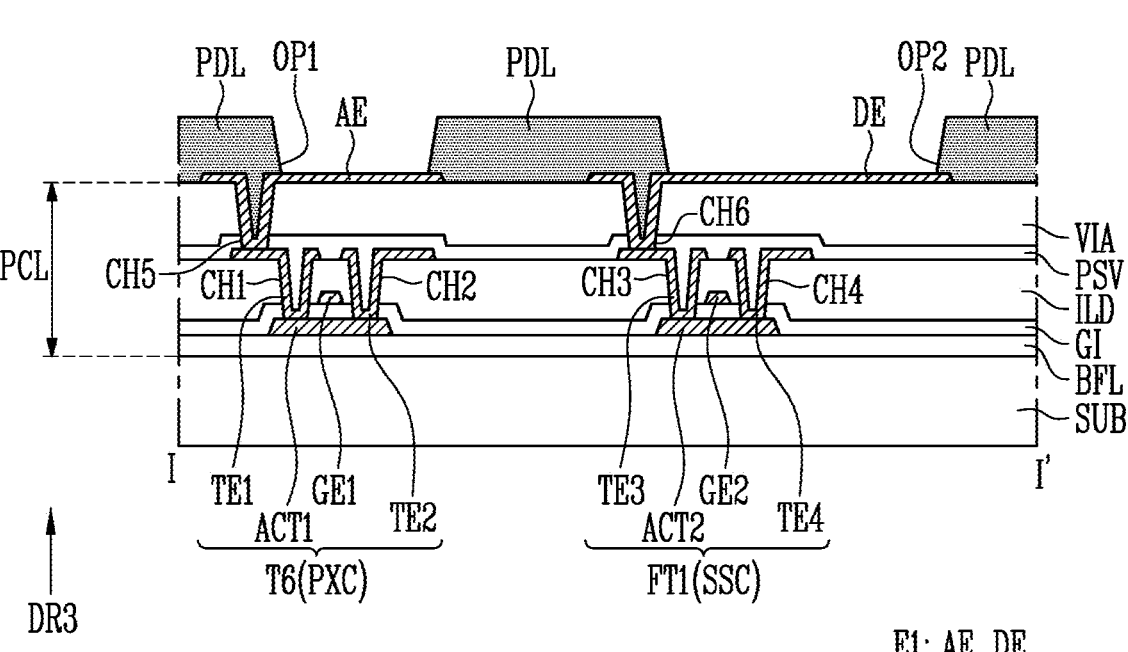

Referring further to FIG. 12B, thereafter, the method of manufacturing the display device may include forming the pixel defining layer PDL on the first electrode layer E1 and the circuit layer PCL (S1130). Here, as described with reference to FIGS. 5 to 9, the pixel defining layer PDL may be disposed and/or formed entirely on the anode electrode AE and the first sensor electrode DE of the first electrode layer E1, and the light emitting area EMA and the light receiving area FXA may be defined (or partitioned) by the pixel defining layer PDL.

Figure 12C:
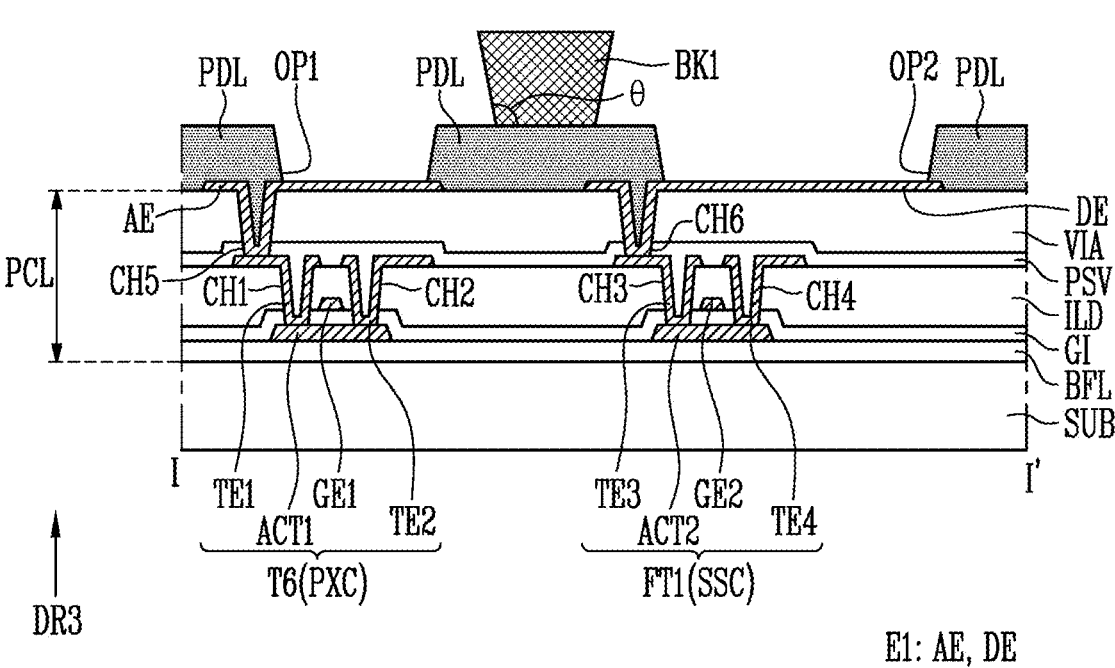

Referring further to FIG. 12C, thereafter, the method of manufacturing the display device may include forming the partition wall (for example, the first partition wall BK1) on the pixel defining layer PDL (S1140). In an embodiment, as described with reference to FIGS. 5 to 10, the first partition wall BK1 may have the reverse taper shape and may include the opening area SOP at least partially opened on a plane (for example, the plane along the first direction DR1 and the second direction DR2).

Figure 12D:
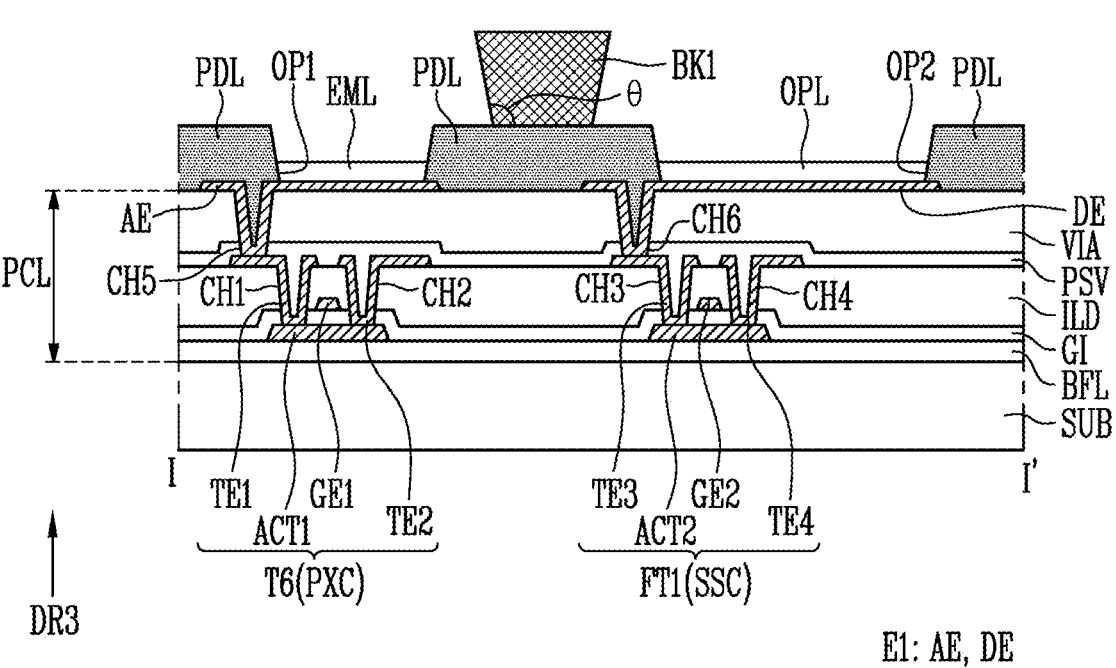

Referring further to FIG. 12D, thereafter, the method of manufacturing the display device may include forming the light emitting layer EML and the light receiving layer OPL on the first electrode layer E1 (S1150). For example, as described with reference to FIGS. 5 and 9, the light emitting layer EML may be disposed and/or formed on the anode electrode AE exposed by the first opening OP1 of the pixel defining layer PDL, and the light receiving layer OPL may be disposed and/or formed on the first sensor electrode DE exposed by the second opening OP2 of the pixel defining layer PDL.

Figure 12E:
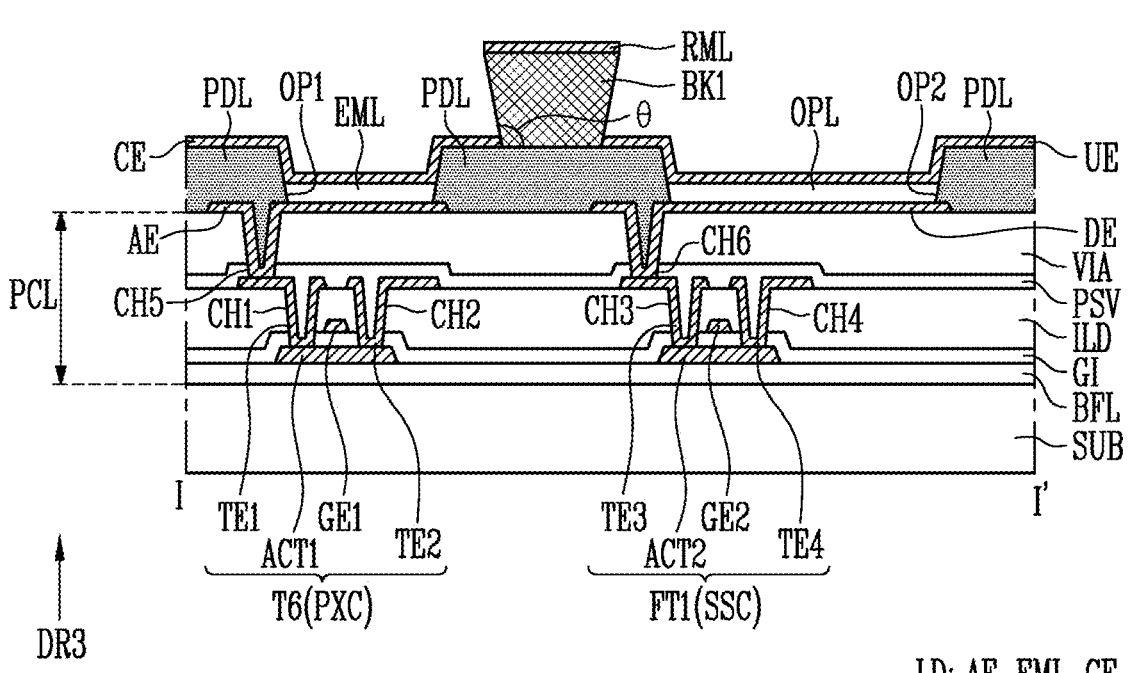

Referring to FIG. 12E, thereafter, the method of manufacturing the display device may include forming the second electrode layer E2 including the cathode electrode CE and the second sensor electrode UE on the pixel defining layer PDL, the light emitting layer EML, and the light receiving layer OPL (S1160). For example, as described with reference to FIGS. 5 and 9, the cathode electrode CE and the second sensor electrode UE of the second electrode layer E2 may be simultaneously formed using a common mask. In this case, the cathode electrode CE and the second sensor electrode UE of the second electrode layer E2 may be spaced apart from each other with respect to the first partition wall BK1 by the first partition wall BK1 having the reverse taper shape. Accordingly, current leakage from the cathode electrode CE to the second sensor electrode UE may be minimized, and thus noise may be minimized when the light sensing pixel PSR recognizes the pattern of the user's finger by sensing the light reflected by the external object (for example, the user's finger or the like).

In addition, in the method of manufacturing the display device according to embodiments of the disclosure, the cathode electrode CE of the first sub-pixel SPX1 and the second sensor electrode UE of the light sensing pixel PSR may be deposited separately from each other through a process using a common mask without using a separate patterning process, a manufacturing process time may be shortened, and a process cost may be reduced.

In addition, as described with reference to FIGS. 5 to 10, as the first partition wall BK1 includes the opening area SOP at least partially opened on a plane (for example, the plane along the first direction DR1 and the second direction DR2 of FIG. 6), the cathode electrode CE and the second sensor electrode UE may be formed in an interconnected form in a partial area. Therefore, the second sensor electrode UE (or the cathode electrode CE) may receive the voltage of the second driving power VS S through the second power line PL2.

In forming the second electrode layer E2 (S1160), the dummy layer RML that is a portion of the second electrode layer E2 may be disposed and/or formed on the partition wall (for example, the first partition wall BK1).

The display device, according to embodiments of the disclosure, may include the partition wall disposed on the pixel defining layer and disposed in a shape surrounding the light receiving area of the light sensing pixels. Accordingly, since the second sensor electrode of the light sensing pixels and the cathode electrode of the sub-pixels are disposed separately, a current leakage phenomenon in which a current flows from the cathode electrode to the second sensor electrode may be reduced (or eliminated). Therefore, noise may be minimized when the light sensing pixel recognizes a pattern of a user's fingerprint by sensing light reflected by an external object (for example, a user's finger or the like).

In addition, in the display device, according to embodiments of the disclosure, since the partition wall is further disposed on the pixel defining layer, an optical path allowing light emitted from the light emitting element of the sub-pixel to proceed to an upper portion of the display device without directly proceeding to the light receiving element of the light sensing pixel. Accordingly, accuracy in recognizing the pattern of the user's fingerprint by the light sensing pixel may be increased.

In addition, even though a separate patterning process is not used, since the cathode electrode of the sub-pixel and the second sensor electrode of the light sensing pixel may be deposited separately from each other in a manufacturing process using a common mask by the partition wall, a manufacturing process time may be shortened, and a process cost may be reduced.

However, an effect of the disclosure is not necessarily limited to the above-described effect, and may be variously expanded without departing from the spirit and scope of the disclosure.

Although the above has been described with reference to the embodiments of the disclosure, those skilled in the art will understand that the disclosure may be variously corrected and modified within the scope without departing from the spirit and scope of the disclosure.

What is claimed is:

1. A display device, comprising:
a substrate;
a circuit layer disposed on the substrate and including a pixel circuit and a sensor circuit;
a pixel element layer disposed on the circuit layer and including a light emitting element electrically connected to the pixel circuit, a light receiving element electrically connected to the sensor circuit, and a pixel defining layer disposed on the circuit layer; and
a partition wall disposed on the pixel defining layer,
wherein the partition wall has a reverse taper shape.

2. The display device according to claim 1, wherein an angle formed between a side surface and a lower surface of the partition wall is greater than 90°.

3. The display device according to claim 1, wherein the light emitting element includes an anode electrode, a light emitting layer disposed on the anode electrode, and a cathode electrode disposed on the light emitting layer, and the light receiving element includes a first sensor electrode, a light receiving layer disposed on the first sensor electrode, and a second sensor electrode disposed on the light receiving layer.

4. The display device according to claim 3, wherein the cathode electrode and the second sensor electrode include a same material.

5. The display device according to claim 4, wherein the cathode electrode and the second sensor electrode are spaced apart from each other with respect to the partition wall disposed between the cathode electrode and the second sensor electrode.

6. The display device according to claim 3, further comprising:

a dummy layer disposed on the partition wall.

7. The display device according to claim 6, wherein the cathode electrode, the second sensor electrode, and the dummy layer include a same material and are spaced apart from each other.

8. The display device according to claim 3, wherein the anode electrode and the first sensor electrode include a same material.

9. The display device according to claim 3, wherein the pixel defining layer is disposed on the anode electrode of the light emitting element and the first sensor electrode of the light receiving element, and the pixel defining layer includes a first opening exposing a portion of the anode electrode and a second opening exposing a portion of the first sensor electrode.

10. The display device according to claim 9, wherein the first opening corresponds to a light emitting area from which light of the light emitting element is emitted, and the second opening corresponds to a light receiving area through which the light receiving element receives the light.

11. The display device according to claim 3, further comprising:

a thin film encapsulation layer disposed on the cathode electrode of the light emitting element and the second sensor electrode of the light receiving element and covering the light emitting element and the light receiving element.

12. The display device according to claim 11, further comprising:

a touch sensor disposed on the thin film encapsulation layer.

13. A display device, comprising:

a substrate; and a pixel element layer disposed on the substrate and including sub-pixels and light sensing pixels, wherein each of the sub-pixels includes a light emitting element and a light emitting area from which light is emitted, wherein each of the light sensing pixels includes a light receiving element outputting a sensing signal corresponding to the light emitted from the light emitting element and a light receiving area receiving the light emitted from the light emitting element, wherein the light emitting area and the light receiving area are spaced apart from each other on the substrate, and wherein a partition wall is disposed between the light emitting area and the light receiving area.

14. The display device according to claim 13, wherein the partition wall at least partially surrounds the light receiving area.

15. The display device according to claim 14, wherein the partition wall includes an opening area that is at least partially opened.

16. The display device according to claim 15, wherein each of the sub-pixels includes a light emitting element, wherein each of the light sensing pixels includes a light receiving element, wherein the light emitting element includes an anode electrode, a light emitting layer disposed on the anode electrode, and a cathode electrode disposed on the light emitting layer, and wherein the light receiving element includes a first sensor electrode, a light receiving layer disposed on the first sensor electrode, and a second sensor electrode disposed on the light receiving layer.

17. The display device according to claim 16, wherein the cathode electrode and the second sensor electrode include a same material.

18. The display device according to claim 17, wherein the cathode electrode and the second sensor electrode are spaced apart from each other with respect to the partition wall disposed between the cathode electrode and the second sensor electrode.

19. The display device according to claim 17, wherein the cathode electrode and the second sensor electrode are integrally formed and are connected to each other through the opening area of the partition wall.

20. The display device according to claim 17, further comprising:

a dummy layer disposed on the partition wall, wherein the dummy layer includes a same material as the cathode electrode and the second sensor electrode.

* * * * *